(12) United States Patent
Cheng et al.

(10) Patent No.: US 12,274,102 B2
(45) Date of Patent: *Apr. 8, 2025

(54) PACKAGE STRUCTURE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Wei-Te Cheng, Taipei (TW); Kuo-Ming Chiu, New Taipei (TW); Meng-Sung Chou, New Taipei (TW); Kai-Chieh Liang, New Taipei (TW); Jie-Ting Tsai, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 681 days.

This patent is subject to a terminal disclaimer.

(21) Appl. No.: 17/141,635

(22) Filed: Jan. 5, 2021

(65) Prior Publication Data

US 2021/0159367 A1  May 27, 2021

Related U.S. Application Data

(63) Continuation-in-part of application No. 16/009,005, filed on Jun. 14, 2018, now Pat. No. 10,916,685.
(Continued)

(30) Foreign Application Priority Data

Nov. 25, 2020  (CN) .......................... 202022763390.1

(51) Int. Cl.
  *H10H 20/85*   (2025.01)
  *H10H 20/856*  (2025.01)
  *H10H 20/857*  (2025.01)

(52) U.S. Cl.
  CPC ...... *H10H 20/8506* (2025.01); *H10H 20/856* (2025.01); *H10H 20/857* (2025.01)

(58) Field of Classification Search
  CPC ............ H10H 20/8506; H10H 20/856; H10H 20/857; H10H 20/036; H10H 20/0362; H10H 20/854; H10H 20/853
  See application file for complete search history.

(56) References Cited

U.S. PATENT DOCUMENTS

| 7,300,183 B2 | 11/2007 | Kiyomoto et al. |
| 7,598,532 B2 | 10/2009 | Fujita et al. |

(Continued)

FOREIGN PATENT DOCUMENTS

| JP | 2009170825 | * | 7/2008 |

OTHER PUBLICATIONS https://patents.google.com/patent/JP2009170825A/ja.*
USPTO, Notice of Allowance issued on Oct. 4, 2022 for U.S. Appl. No. 17/671,762.

*Primary Examiner* — Su C Kim
(74) *Attorney, Agent, or Firm* — Li & Cai Intellectual Property (USA) Office

(57) ABSTRACT

A package structure is provided. The package structure includes a substrate, an electrode layer, a lighting unit, a wall, and a package compound. The substrate and the wall that is disposed on the substrate jointly define an accommodating space. The lighting unit in the accommodating space and is electrically connected to the electrode layer disposed on the substrate. The package compound covers the electrode layer, and the lighting unit. The package compound includes an attaching portion disposed on a top (Continued)

surface of the lighting unit and a surrounding portion that is arranged around the attaching portion. The surrounding portion has an annular slot arranged on a top surface thereof. A bottom end of the annular slot is located at a position aligning with 25%~90% of a thickness of the lighting diode along a height direction.

18 Claims, 20 Drawing Sheets

Related U.S. Application Data

(60) Provisional application No. 63/045,301, filed on Jun. 29, 2020, provisional application No. 62/519,218, filed on Jun. 14, 2017.

(56) References Cited

U.S. PATENT DOCUMENTS

| | | | |
|---|---|---|---|
| 10,147,834 | B2 | 12/2018 | Herard et al. |
| 10,916,685 | B2 | 2/2021 | Cheng et al. |
| 2003/0219919 | A1* | 11/2003 | Wang .............. H10H 20/8506 257/E33.072 |
| 2006/0138621 | A1* | 6/2006 | Bogner ............. H10H 20/858 257/678 |
| 2009/0278147 | A1 | 11/2009 | Suzuki |
| 2012/0112227 | A1* | 5/2012 | Toyama ............. H01L 25/0753 257/E33.072 |
| 2012/0217531 | A1 | 8/2012 | Katsuno et al. |
| 2013/0037842 | A1* | 2/2013 | Yamada ................ H01L 33/62 257/E33.072 |
| 2013/0105853 | A1* | 5/2013 | Kneissl ................. H01L 33/32 257/E33.066 |
| 2013/0168709 | A1 | 7/2013 | Lin |
| 2014/0071689 | A1* | 3/2014 | Yoon ..................... H01L 33/54 362/296.01 |
| 2015/0287894 | A1* | 10/2015 | Toita .................... H01L 33/54 257/98 |
| 2018/0248086 | A1 | 8/2018 | Bai et al. |

* cited by examiner

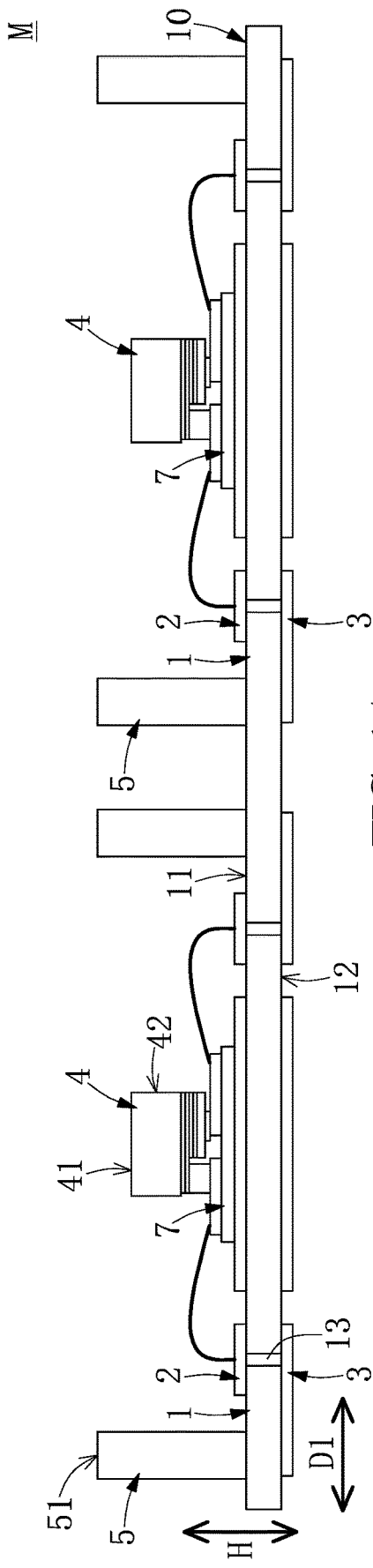
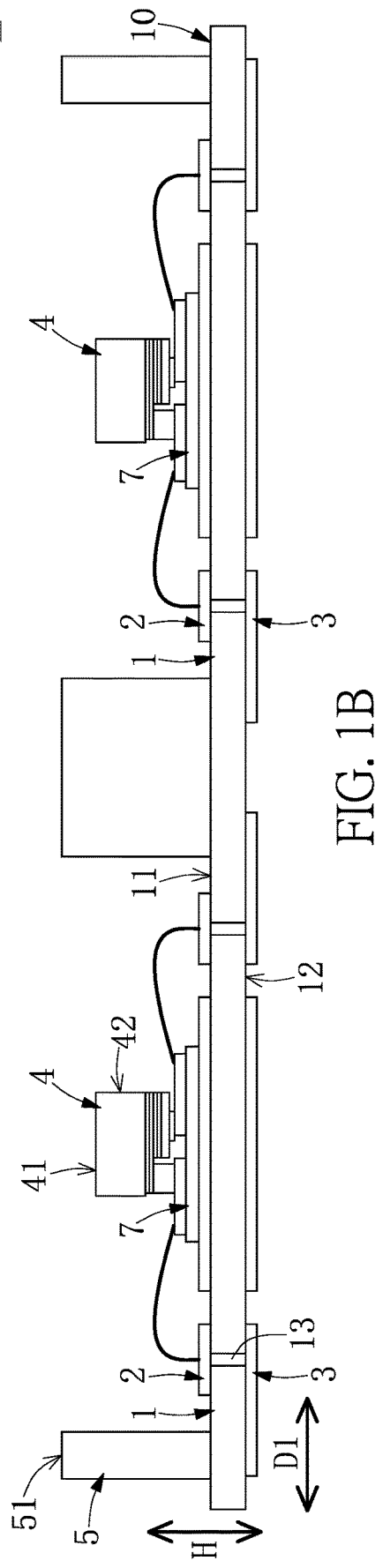

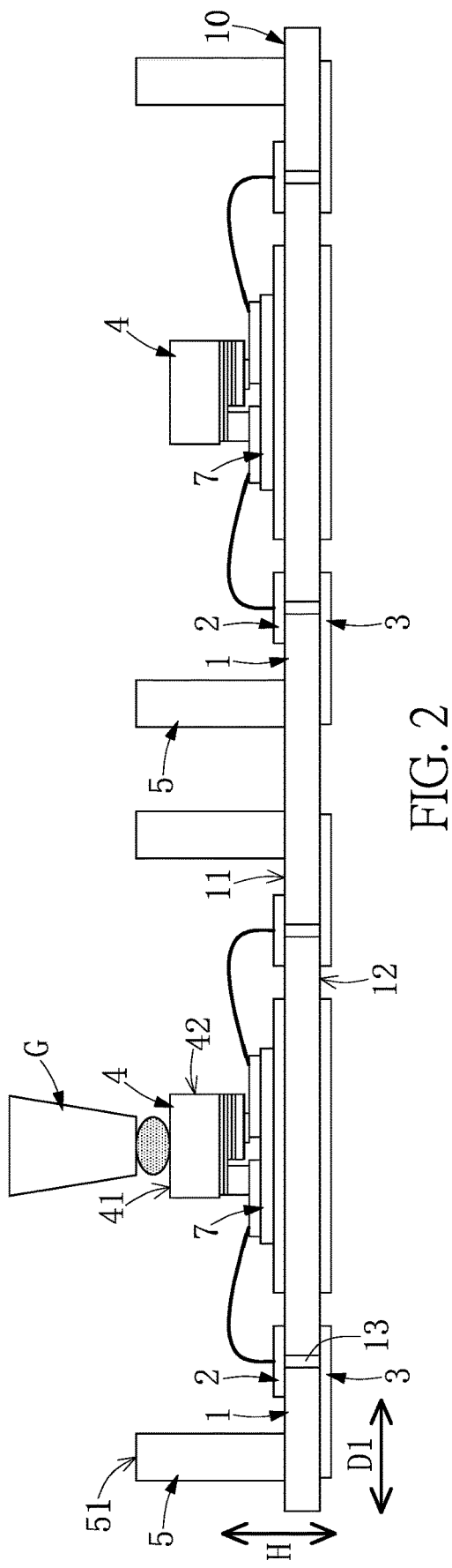
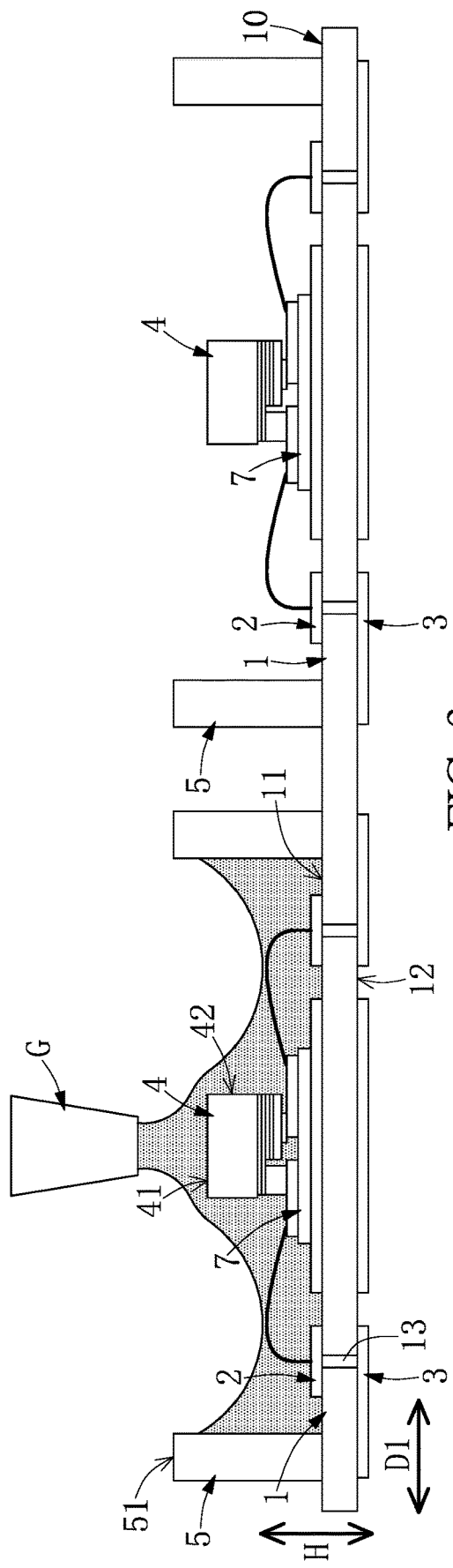
FIG. 2
FIG. 3

PACKAGE STRUCTURE

CROSS-REFERENCE TO RELATED PATENT APPLICATION

This application claims priority to the U.S. Provisional Patent Application Ser. No. 63/045,301 filed on Jun. 29, 2020 and No. 62/519,218 filed on Jun. 14, 2017, which applications are incorporated herein by reference in its entirety.

This application claims the benefit of priority to China Patent Application No. 202022763390.1, filed on Nov. 25, 2020 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure; in particular, to a package structure.

BACKGROUND OF THE DISCLOSURE

A conventional package structure is provided with a package compound fully filled in a space defined by a wall of the conventional package structure.

SUMMARY OF THE DISCLOSURE

The present disclosure relates to a package structure, and more particularly to a package structure capable of increasing the performance.

In one aspect, the present disclosure provides a package structure includes a substrate, an electrode layer, a lighting unit, a wall, and a package compound. The electrode layer is disposed on the substrate. The lighting unit is disposed on the substrate and is electrically connected to the electrode layer. The lighting unit has a top surface and a surrounding lateral surface connected to a peripheral edge of the top surface. The wall is disposed on the substrate. The wall and the substrate jointly define an accommodating space, and the lighting unit is disposed in the accommodating space. The package compound is disposed in the accommodating space. The package compound allow light generated by the lighting unit to pass there-through. The package compound covers the electrode layer, and the lighting unit. The package compound includes an attaching portion and a surrounding portion. The attaching portion adheres to a top surface of the lighting unit. The surrounding portion is arranged around the attaching portion and has an inner annular part and an outer annular part. The inner annular part is arranged adjacent to the attaching portion, the surrounding portion is connected to an inner surface of the wall, the surrounding portion has an annular slot formed on a top surface thereof, and a bottom end of the annular slot is located at a position aligning with 25%~90% of a thickness of the lighting unit along a height direction. The lighting unit is arranged at a center of the package compound and the surrounding portion is formed symmetrically about the attaching portion.

In certain embodiments, the package structure further includes a reflective layer disposed in the accommodating space, and the reflective layer at least covers a part of the electrode layer and is covered by the package compound.

In certain embodiments, the reflective layer contains a plurality of reflective particles that are within a range within from 30 to 50 wt % based on a weight of the reflective layer.

In certain embodiments, the reflective layer has a first curved surface that is formed along an inner side of the wall and a part of the substrate adjacent to the wall. A center of a curvature of the first curved surface is arranged outside of the accommodating space.

In certain embodiments, a height of the first curved surface relative to the substrate is less than or equal to a height of the top surface of the lighting unit relative to the substrate.

In certain embodiments, a top surface of the surrounding portion is in a curved shape so as to define as a second curved surface, and a center of a curvature of the second curved surface is arranged outside of the accommodating space.

In certain embodiments, the curvature of the first curved surface is greater than the curvature of the second curved surface.

In certain embodiments, the reflective layer has an inclined surface that is formed along an inner side of the wall and a part of the substrate adjacent to the wall.

In certain embodiments, a height of the inclined surface of the reflective layer relative to the substrate is less than or equal to a height of the top surface of the lighting unit relative to the substrate.

In certain embodiments, a diameter of the reflective particles is within a range from 10 micrometers to 20 micrometers.

In certain embodiments, the reflective particles are selected from the group consisting of Teflon®, aluminum, and zirconium dioxide (ZrO2).

In certain embodiments, the package structure further includes a submount disposed on the electrode layer. The lighting unit is electrically connected to two electrodes of the submount, and an electrical connection between the lighting unit and the electrode layer is established by wiring the two electrodes of the submount to the electrode layer.

In certain embodiments, a material of the package compound includes a polydimethylsiloxane (PDMS) or a fluoropolymer.

In certain embodiments, a top end of the package compound has a cross section that is in a substantial W shape.

In certain embodiments, the package structure further includes a lens unit. The lens unit is disposed on a top end of the wall so as to close the accommodating space, and the accommodating space is vacuum.

In certain embodiments, the lens unit includes a body and an antireflection layer.

In certain embodiments, the body has a base portion and a bending portion connected to the base portion. The base portion is disposed on the top end of the wall, the bending portion corresponds in position to the lighting unit, and two ends of the bending portion correspond in position to the annular slot. The antireflection layer is arranged on a side surface of the lens unit away from the substrate.

In certain embodiments, the reflective adhesive layer completely covers the electrode layer.

In certain embodiments, a height of the outer annular part with respect to the substrate is greater than a height of the top surface of the lighting unit with respect to the substrate.

In another aspect, the present disclosure provides a package structure. The package structure includes a substrate, an electrode layer, a lighting unit, a wall, a reflective layer, and a package compound. The electrode layer is disposed on the substrate. The lighting unit is disposed on the substrate and is electrically connected to the electrode layer. The lighting unit has a top surface and a surrounding lateral surface connected to a peripheral edge of the top surface. The wall is disposed on the substrate. The wall and the substrate jointly define an accommodating space, and the lighting unit is disposed in the accommodating space. The reflective layer is disposed in the accommodating space and at least covers a part of the electrode layer. The package compound is disposed in the accommodating space. The package compound allow light generated by the lighting unit to pass there-through. The package compound completely covers the reflective layer, the electrode layer, and the lighting unit. The package compound includes an attaching portion and a surrounding portion. The attaching portion adheres to a top surface of the lighting unit. The surrounding portion is arranged around the attaching portion. The surrounding portion is connected to an inner surface of the wall, the surrounding portion has an annular slot formed on a top surface thereof, and a bottom end of the annular slot is located at a position aligning with 25%~90% of a thickness of the lighting unit along a height direction. The lighting unit is arranged at a center of the package compound and the surrounding portion is formed symmetrically about the attaching portion.

Therefore, the present disclosure provides a package structure to solve the drawbacks associated with conventional package structures, thereby increasing the performance of the package structure (e.g., a lighting efficiency) through particular configuration of a package compound.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings, wherein:

FIG. 1A is a schematic view showing step S110 of a manufacturing method of a package structure according to a first embodiment of the present disclosure;

FIG. 1B is a schematic view showing step S110' of the manufacturing method according to the first embodiment of the present disclosure;

FIG. 2 is a first schematic view showing step S120 of the manufacturing method according to the first embodiment of the present disclosure;

FIG. 3 is a second schematic view showing step S120 of the manufacturing method according to the first embodiment of the present disclosure;

DETAILED DESCRIPTION OF THE EXEMPLARY EMBODIMENTS

Figure 4:
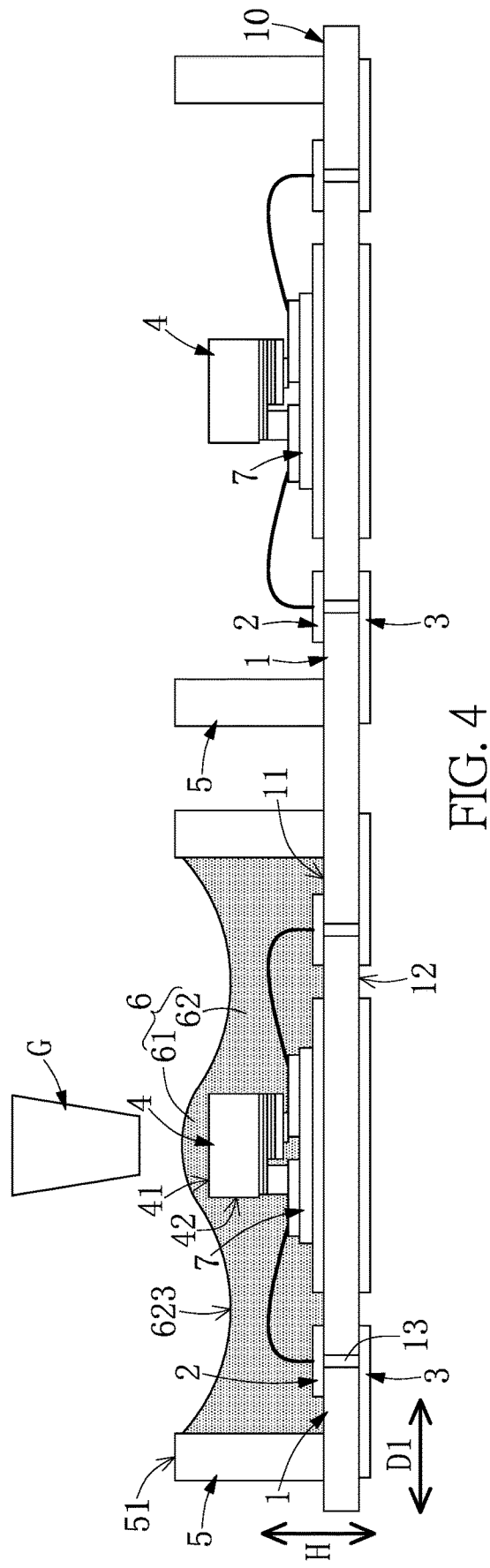
FIG. 4 is a third schematic view showing step S120 of the manufacturing method according to the first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIGS. 1A to 14, which illustrate a first embodiment of the present disclosure. The present embodiment discloses a package structure 100 and a manufacturing method thereof. In the present embodiment, the package structure 100 is an ultraviolet light-emitting diode for example, but the present disclosure is not limited thereto. In order to easily realize the package structure 100, the present embodiment discloses the manufacturing method thereof, and then discloses the structure and connection relationship of each component of the package structure 100.

As shown in FIGS. 1A to 13, the manufacturing method of the present embodiment includes steps S110~S170. However, in other embodiments of the present disclosure, any one of the steps S110~S170 can be omitted or changed by a reasonable step according to design requirements.

Figure 5:
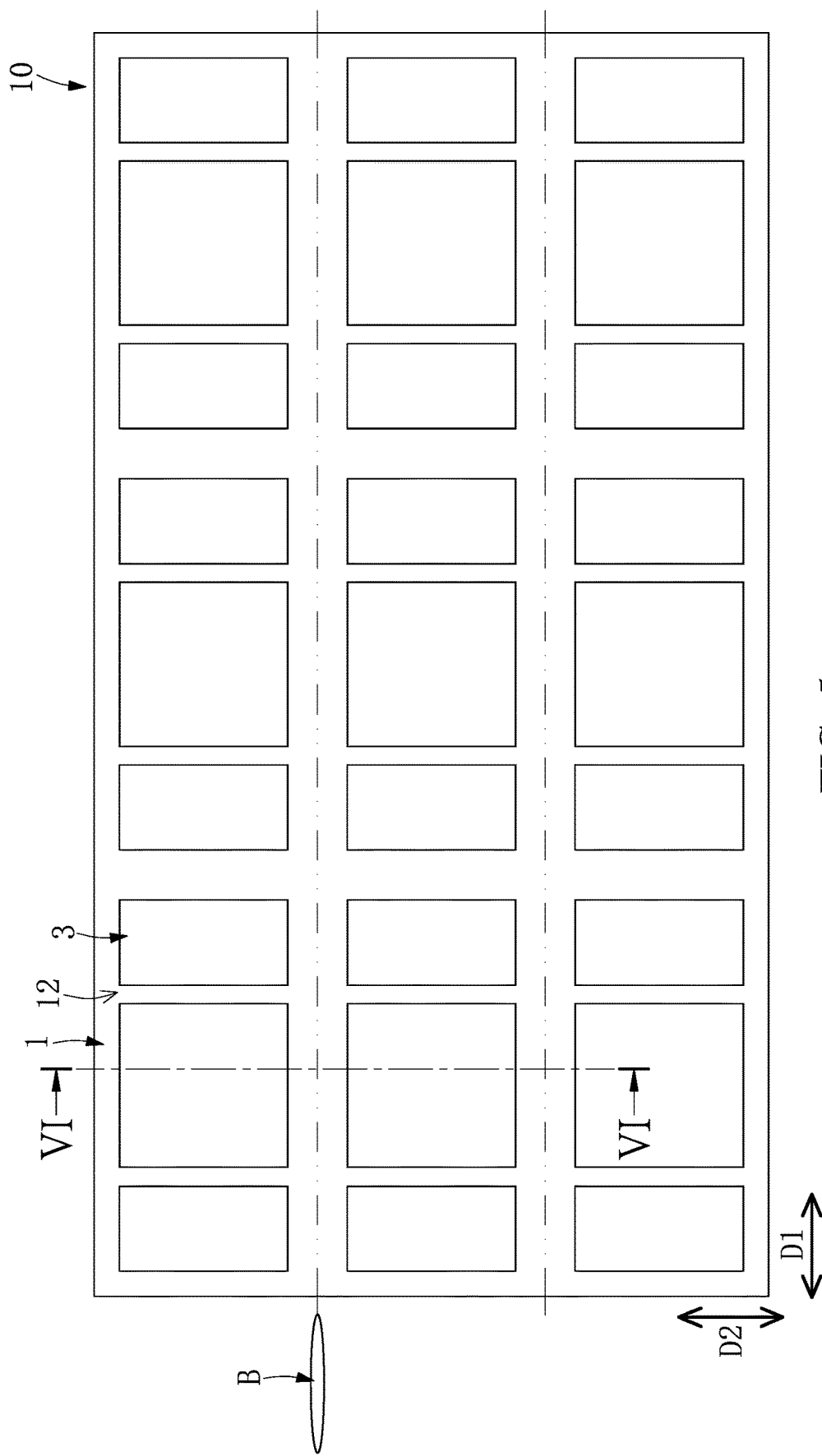
FIG. 5 is a schematic view showing step S130 of the manufacturing method according to the first embodiment of the present disclosure.

As shown in FIG. 1A, the step S110 is carried out by providing a carrier module M. The carrier module M includes a substrate assembly 10, a plurality of pairs of electrodes 2, a plurality of solder pad layers 3, a plurality of lighting diodes 4, and a plurality of annular walls 5. In the present embodiment, each pair of electrodes 2 is an electrode layer 2 for example, and each of the lighting diodes 4 is an ultraviolet light-emitting diode chip for example, but the present disclosure is not limited thereto. Specifically, the substrate assembly 10 includes a plurality of substrates 1 (as shown in FIG. 5) that are integrally formed as a one-piece structure and are connected to each other along a first direction D1 and a second direction D2 perpendicular to the first direction D1. Moreover, each of the substrates 1 has a first surface 11 and a second surface 12 opposite to the first surface 11. Each of the first surface 11 and the second surface 12 is substantially parallel to the first direction D1 and the second direction D2 (as shown in FIG. 5).

The electrode layers 2 are respectively disposed on the first surfaces 11 of the substrates 1, and the walls 5 are respectively disposed on the first surfaces 11 of the substrates 1. The lighting diodes 4 are respectively disposed in the space surrounded by the walls 5, and the lighting diodes 4 are arranged to respectively correspond in position to the first surfaces 11 of the substrates 1. The solder pad layers 3 are respectively disposed on the second surfaces 12 of the substrates 1.

The electrode layer 2, the lighting diode 4, and the solder pad layer 3, which are disposed on the same substrate 1, are electrically connected to each other. Specifically, each of the substrates 1 is provided with a plurality of conductive pillars 13 embedded therein. An end of each of the conductive pillars 13 is exposed from the first surface 11 of the substrate 1 and is connected to the electrode layer 2, and another end of each of the conductive pillars 13 is exposed from the second surface 12 of the substrate 1 and is connected to the solder pad layer 3, such that the electrode layer 2 and the solder pad layer 3 are electrically connected to each other through the conductive pillars 13.

Moreover, the electrical connection manner between the lighting diode 4 and the electrode layer 2 can be adjusted or changed according to design requirements. For example, as shown in FIG. 1A, the lighting diode 4 is connected to a submount 7 fixed on the electrode layer 2 in a flip-chip bonding manner, and the submount 7 is electrically connected to the electrode layer 2 in a wiring manner for establishing the electrical connection between the lighting diode 4 and the electrode layer 2. Or the lighting diode 4 can be directly mounted on the electrode layer 2 for establishing the electrical connection therebetween.

As shown in FIGS. 2 to 4, the step S120 is carried out by implementing a dispensing process to each space inside of the walls 5 by using a dispenser G. As shown in FIG. 2, in each of the dispensing processes, the dispenser G outputs a package compound 6 toward a top surface 41 of the lighting diode 4 so as to form an attaching portion 61 arranged on the top surface 41 of the lighting diode 4. As shown in FIG. 3, the package compound 6 further flows from a peripheral part of the attaching portion 61 toward the wall 5 and the substrate 1 so as to form a surrounding portion 62. As shown in FIG. 4, the electrode layer 2 and the lighting diode 4 are embedded in the package compound 6. The surrounding portion 62 has an annular slot formed on a top surface 623 thereof, a bottom end 6231 of the annular slot is located at a position aligning with 25%~90% of a thickness T of an lighting unit U (e.g., the lighting diode 4 and the submount 7) along a height direction H that is perpendicular to the first surface 11, but the present disclosure is not limited thereto.

It should be noted that the thickness T of the lighting unit U in the present embodiment is defined by a distance from a bottom end of the submount 7 to the top surface 41 of the lighting diode 4. In other words, the bottom end of the submount 7 is aligned with a position corresponding to 0% of the thickness T, and the top surface 41 of the lighting diode 4 is aligned with a position corresponding to 100% of the thickness T.

Specifically, as shown in FIGS. 2 to 4, in each of the dispensing processes, the dispenser G starts to output the package compound 6 at a first position that is about 0.2 mm above the top surface 41 of the lighting diode 4 (as shown in FIG. 2), and then the dispenser G gradually moves in a direction away from the top surface 41 (an upward direction as shown in FIG. 3) until reaching a second position that is about 0.5 mm above the top surface 41 of the lighting diode 4 (as shown in FIG. 4). Moreover, the dispenser G at the second position stops outputting the package compound 6 for 0.3 seconds, but the present disclosure is not limited thereto.

Figure 6:
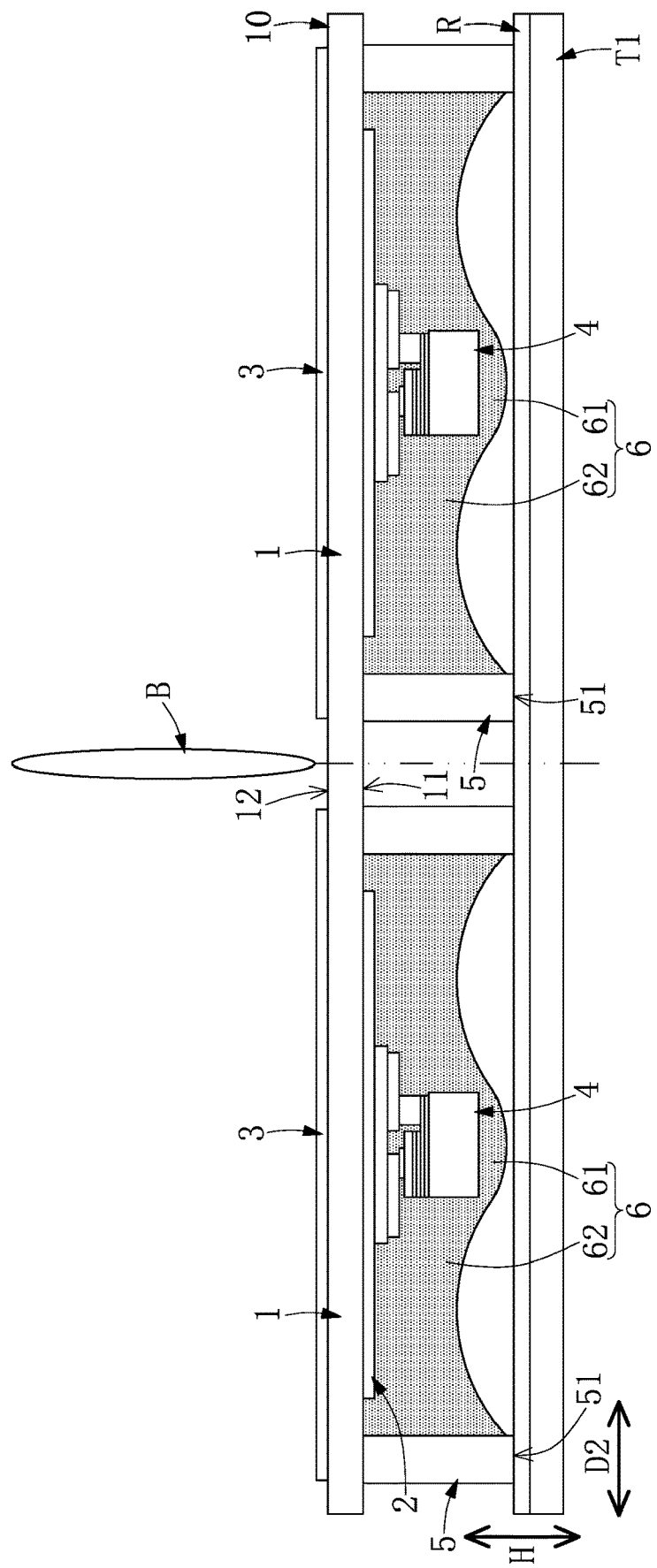
FIG. 6 is a schematic view showing steps S130 and S140 of the manufacturing method according to the first embodiment of the present disclosure.

As shown in FIGS. 5 and 6, the step S130 is carried out by attaching a top end 51 of each of the walls 5 onto a release film R that is adhered to a first tape T1. The release film R and the first tape T1 in the present embodiment can each be a pyrolysis film (or tape), a thermal-resistant film (or tape), or a UV film (or tape), but the present disclosure is not limited thereto.

Figure 7:
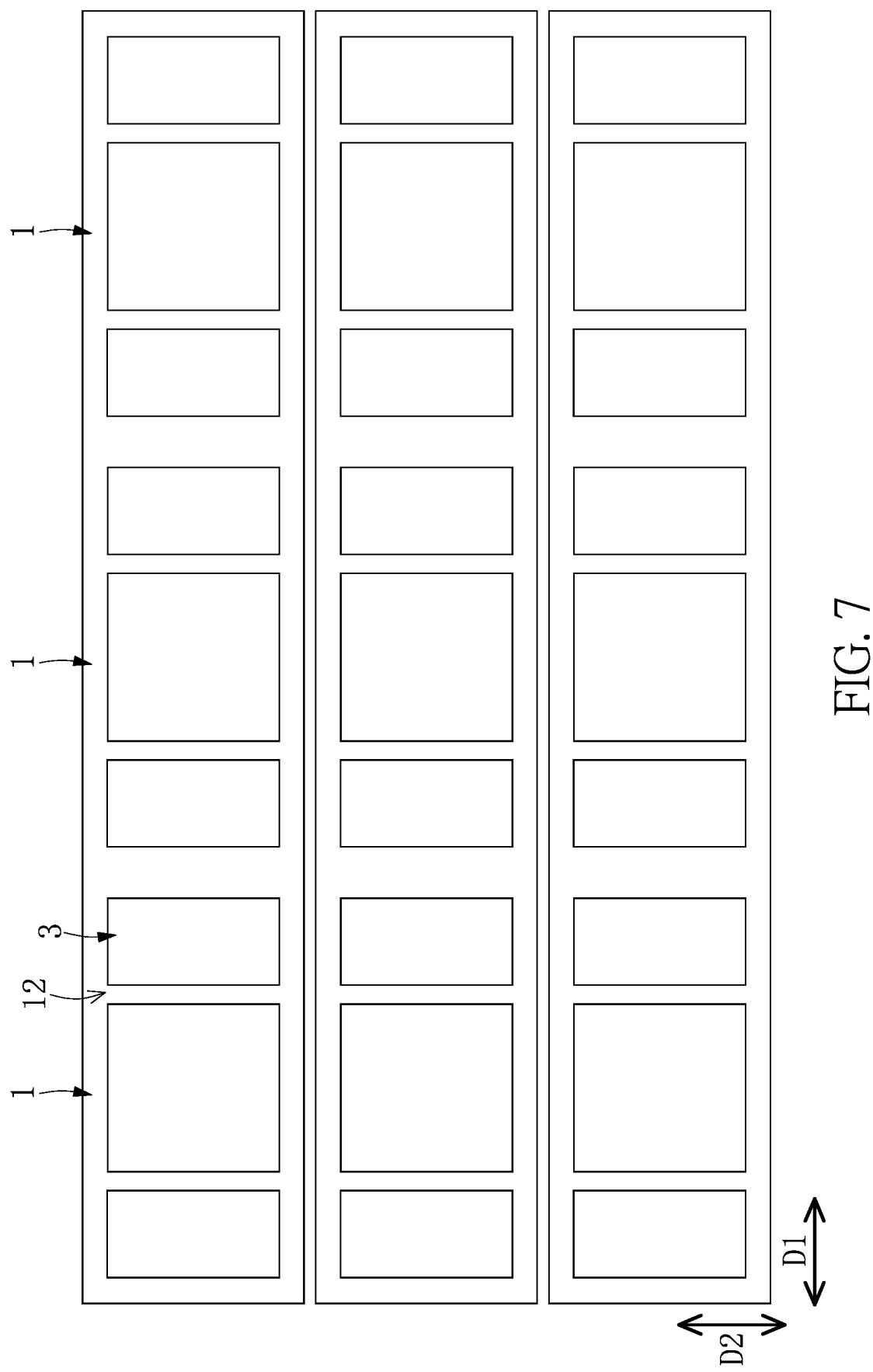
FIG. 7 is a schematic view showing step S140 of the manufacturing method according to the first embodiment of the present disclosure.

As shown in FIGS. 6 and 7, the step S140 is carried out by using a blade B to slice from the second surfaces 12 of the substrate assembly 10 along the first direction D1 (as shown in FIGS. 5 and 6) to form a plurality of rows of the substrates 1 that are separate from each other (as shown in FIG. 7). In other words, the substrates 1 of the substrate assembly 10 are respectively connected along the first direction D1 so as to form the rows of the substrates 1 as shown in FIG. 7, and the rows of the substrates 1 separate from each other along the second direction D2.

Figure 8:
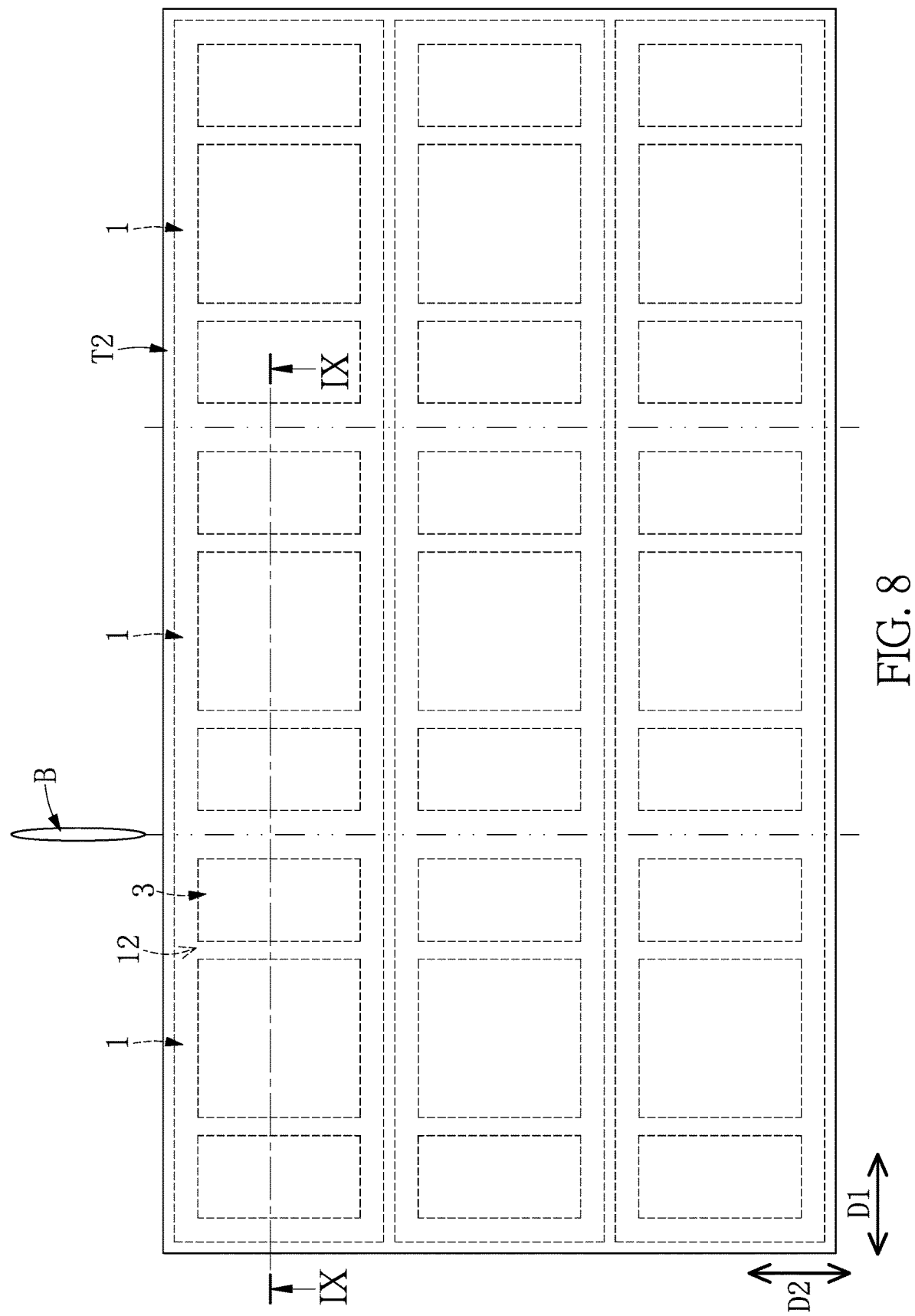
FIG. 8 is a schematic view showing step S150 of the manufacturing method according to the first embodiment of the present disclosure.
Figure 9:
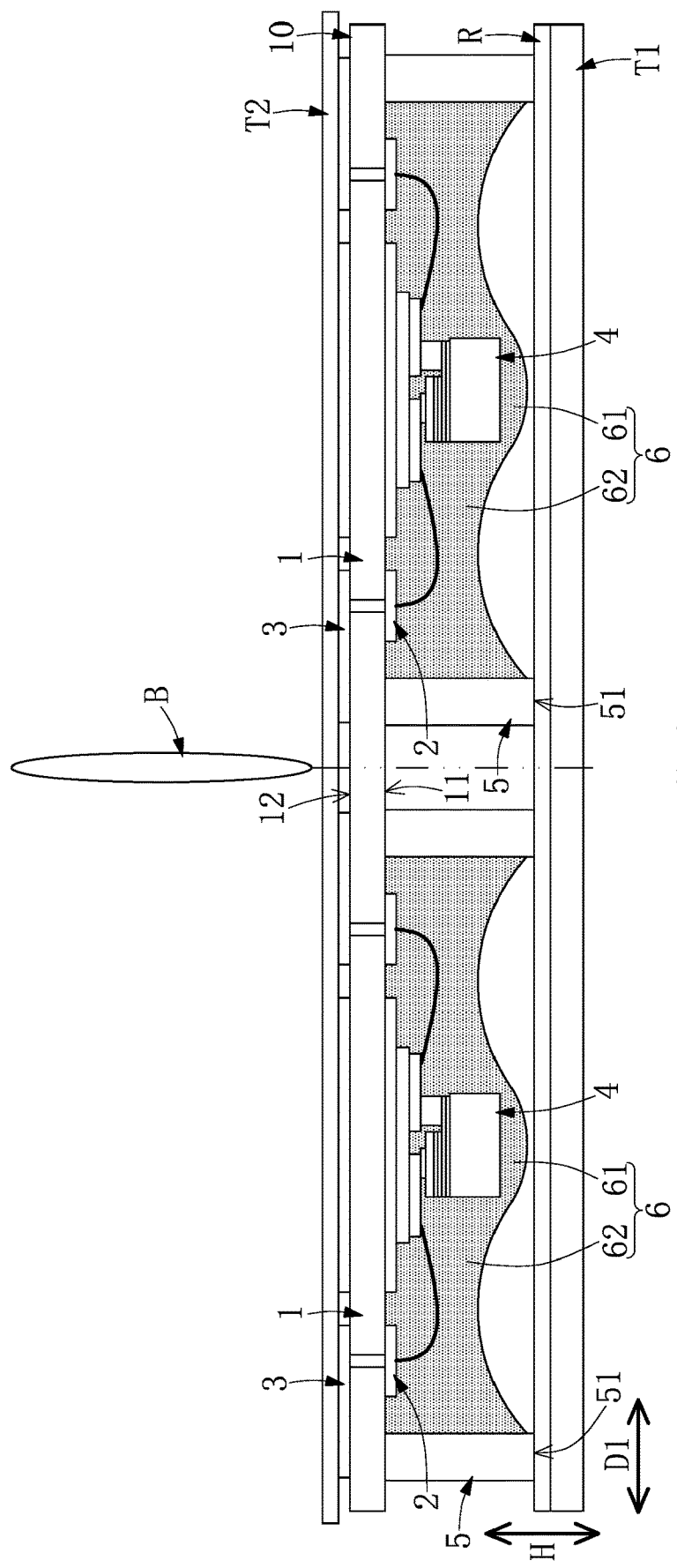
FIG. 9 is a schematic view showing steps S150 and S160 of the manufacturing method according to the first embodiment of the present disclosure.

As shown in FIGS. 8 and 9, the step S150 is carried out by attaching the second surfaces 12 of the rows of the substrates 1 onto a second tape T2 (e.g., adhering the second tape T2 to the solder pad layers 3). The second tape T2 in the present embodiment can be a pyrolysis tape, a thermal-resistant tape, or a UV tape, but the present disclosure is not limited thereto. In other words, the relative positions of the rows of the substrates 1 can be effectively maintained by attaching the rows of the substrates 1 onto the second tape T2.

Figure 10:
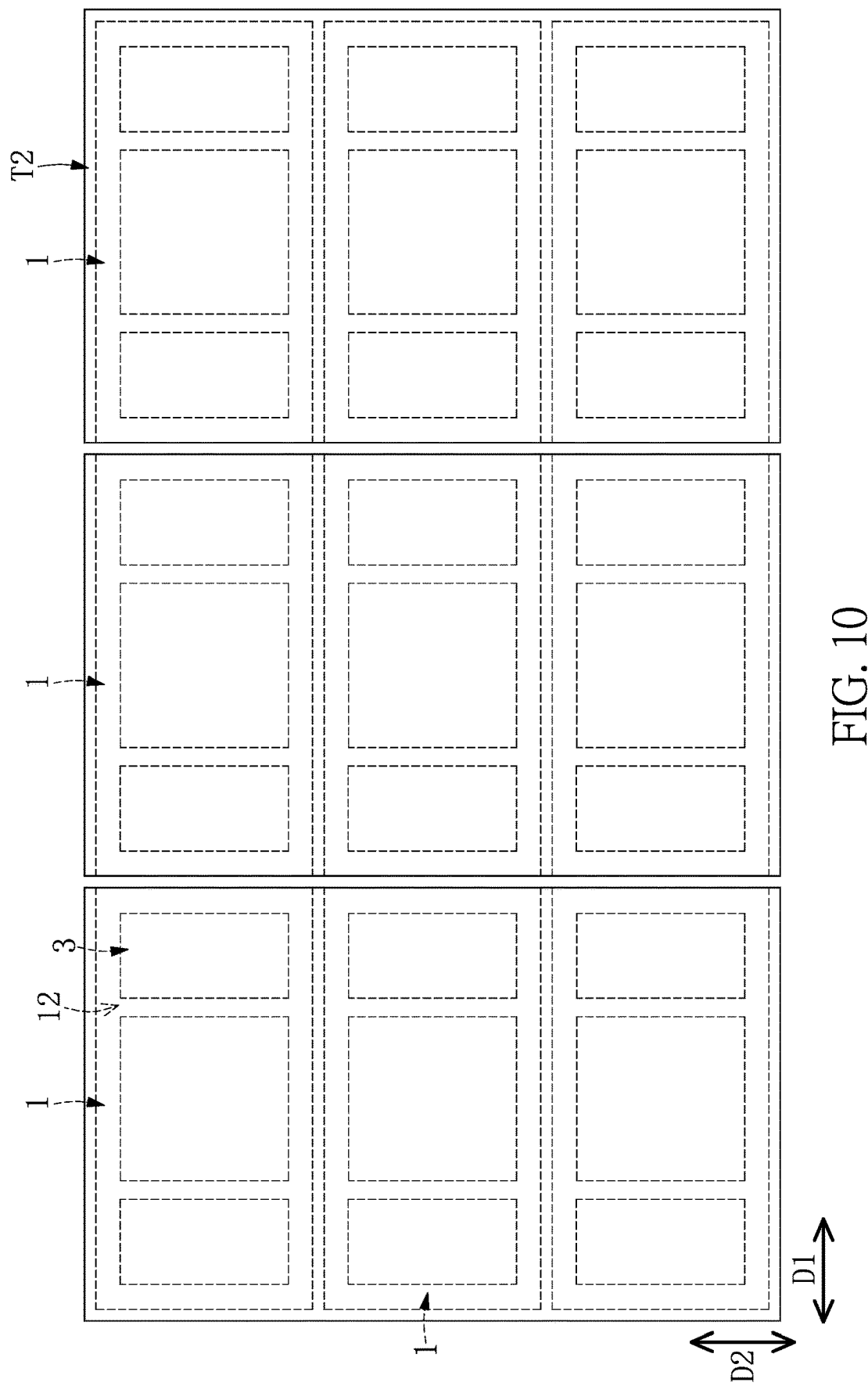
FIG. 10 is a schematic view showing step S160 of the manufacturing method according to the first embodiment of the present disclosure.

As shown in FIGS. 9 and 10, the step S160 is carried out by using the blade B to slice the rows of the substrates 1 from the second tape T2 along the second direction D2 so as to form the substrates 1 that are separate from each other and are in a matrix arrangement as shown in FIG. 10. Specifically, the substrates 1 can be rotated about 90 degrees in the steps S140 and S160, such that the slicing of the step S140 along the first direction D1 and the slicing of the step S160 along the second direction D2 can be easily implemented by the blade B, but the present disclosure is not limited thereto. For example, in other embodiments of the present disclosure, the blade B can be rotated about 90 degrees in the step S160 for easy slicing along the second direction D2.

Figure 11:
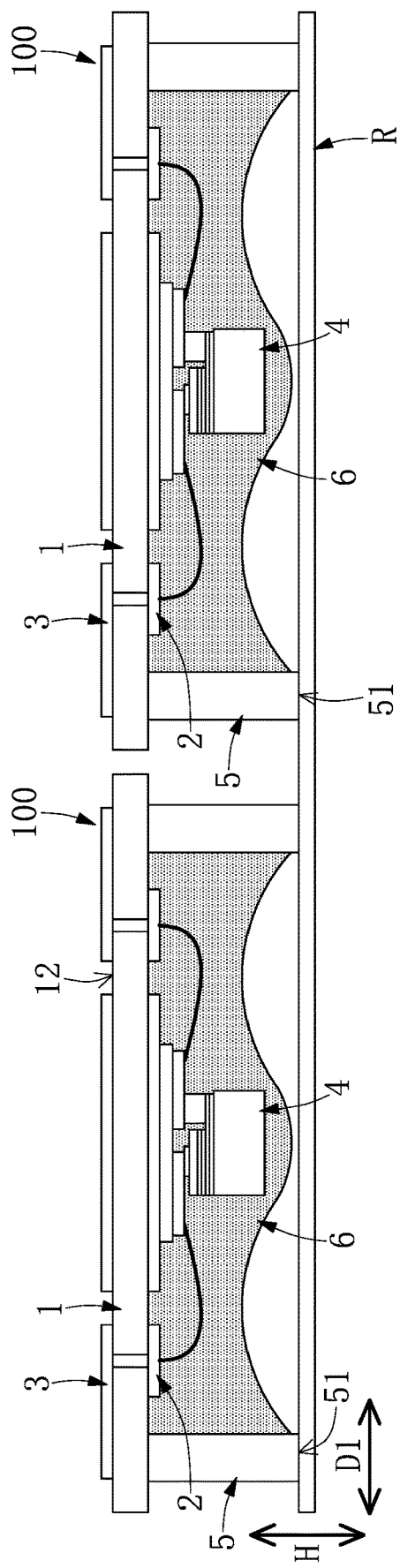
FIG. 11 is a first schematic view showing step S170 of the manufacturing method according to the first embodiment of the present disclosure.
Figure 12:
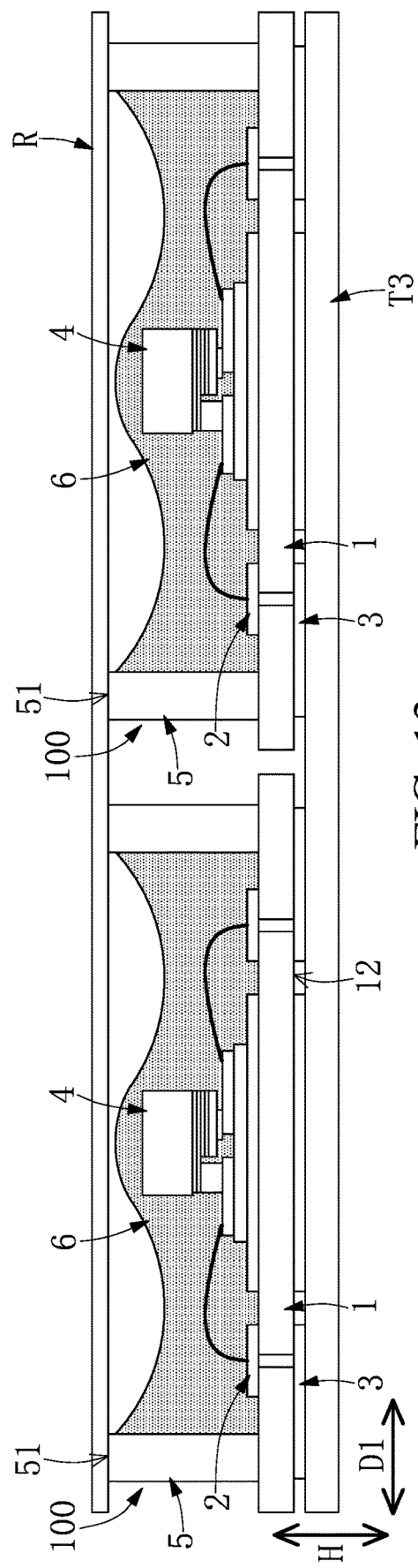
FIG. 12 is a second schematic view showing step S170 of the manufacturing method according to the first embodiment of the present disclosure.
Figure 13:
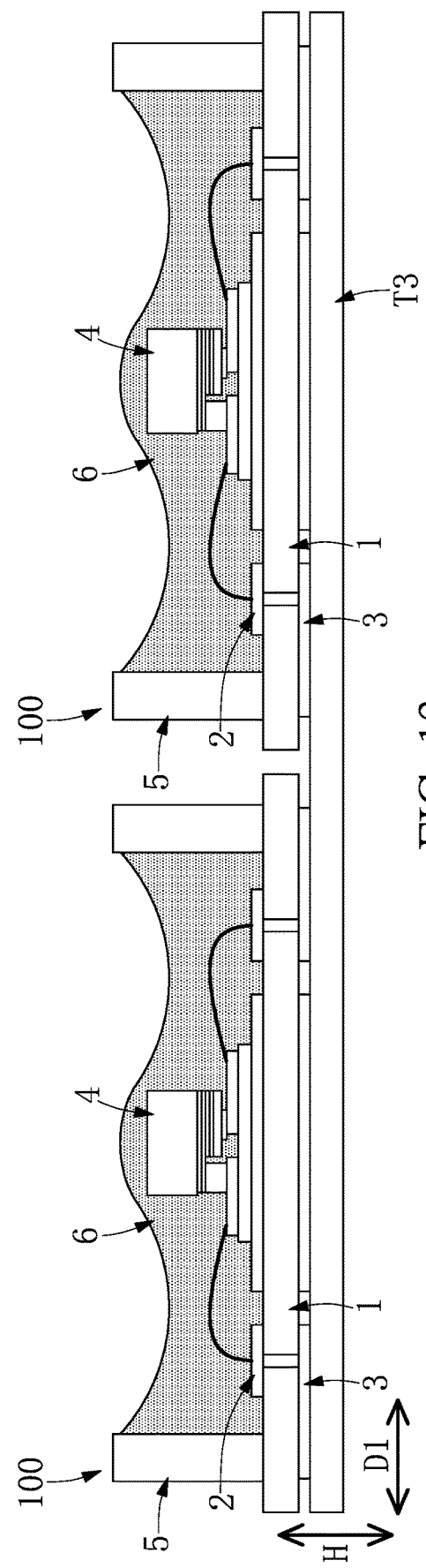
FIG. 13 is a third schematic view showing step S170 of the manufacturing method according to the first embodiment of the present disclosure.

As shown in FIGS. 11 to 13, the step S170 is carried out by removing the first tape T1, the second tape T2, and the release film R to obtain a plurality of LED package structures 100, such as a package structures. In the step S170, the release film R is preferably removed after removing the first tape T1 and the second tape T2. In the step S170, after the first tape T1 and the second tape T2 are removed as shown in FIG. 11, a third tape T3 can be attached onto the second surfaces 12 of the substrates 1 as shown in FIG. 12 (e.g., the third tape T3 is adhered to the solder pad layers 3), and then the release film R is removed to obtain the LED package structures 100 as shown in FIG. 13.

Moreover, a pre-process can be implemented on the first tape T1, the second tape T2, or the release film R for reducing the adhesion of the first tape T1, the second tape T2, or the release film R, such that the first tape T1, the second tape T2, and the release film R can be more easily removed. For example, the pre-process related to the release film R includes that the release film R can be heated, irradiated with a UV light, or contacted with an organic solution, thereby reducing the adhesion of the release film R with respect to each of the walls 5.

In addition, the step S110 can be replaced by step S110', and the step S110' is carried out by providing a carrier module M as shown in FIG. 1B. Specifically, a portion of the walls 5 arranged between any two adjacent lighting diodes 4 can be formed as one piece structure that is sliced in the steps S140, S160.

The manufacturing method of the present embodiment has been disclosed in the above description, and the following description discloses the package structure 100 prepared by using the manufacturing method of the present embodiment, but the present disclosure is not limited thereto. That is to say, the package structure 100 of the present embodiment can be prepared by using a method other than the manufacturing method of the present embodiment.

Figure 14A:
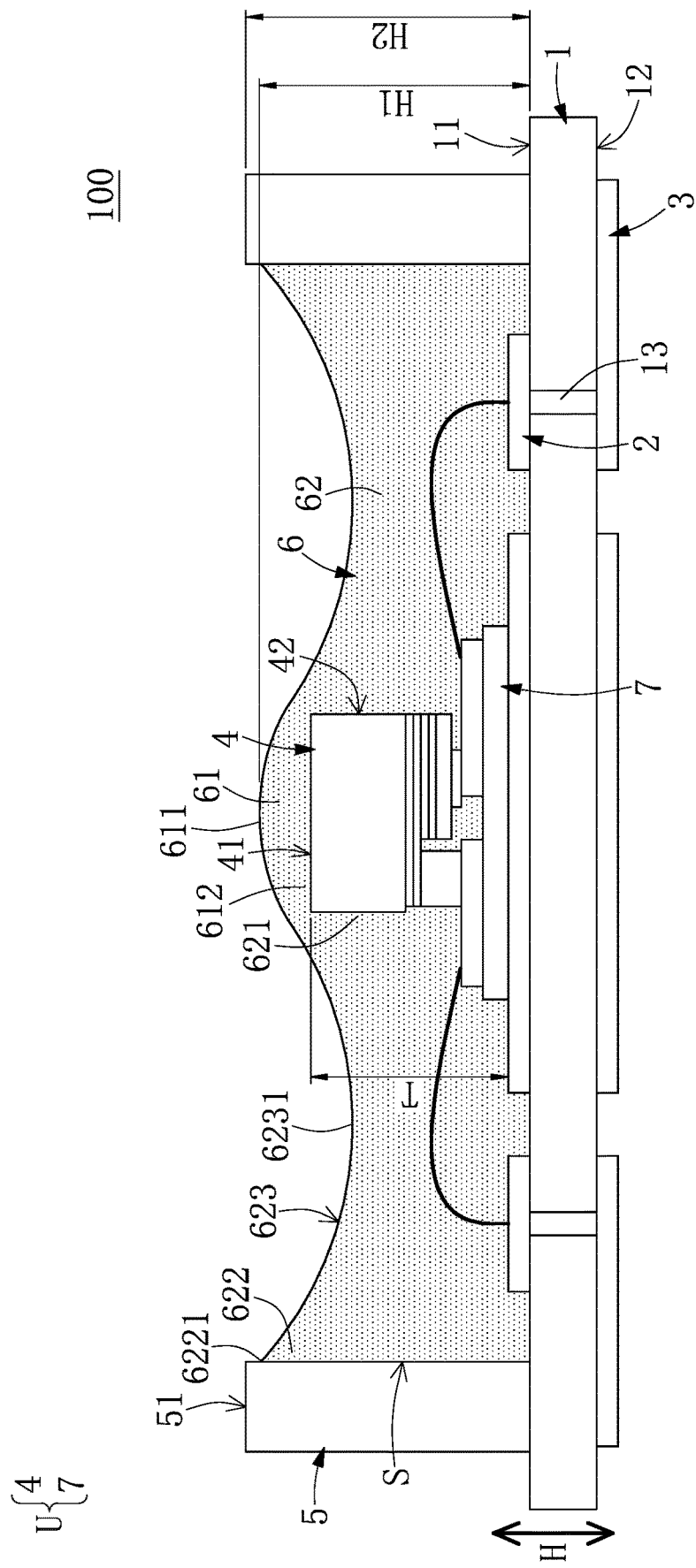
FIG. 14A is a schematic view showing the package structure according to the first embodiment of the present disclosure.

As shown in FIG. 14A, the package structure 100 includes a substrate 1, an electrode layer 2, a solder pad layer 3, a lighting unit U, an annular wall 5, and a package compound 6. In the present embodiment, the lighting unit U is an UV lighting unit for example, but the present disclosure is not limited thereto. In other embodiments of the present disclosure, the lighting unit U can be a laser lighting unit. The electrode layer 2 and the solder pad layer 3 are electrically connected to each other, and are disposed on two opposite surfaces of the substrate 1. The lighting unit U is disposed on the substrate 1 and is electrically connected to the electrode layer 2. The wall 5 is disposed on the substrate 1 and is arranged around the lighting unit U. The package compound 6 is disposed in the wall 5, and the lighting unit U is embedded in the package compound 6. The following description further discloses the structure and connection relationship of each component of the package structure 100.

The substrate 1 in the present embodiment is a ceramic substrate, but the present disclosure is not limited thereto. The substrate 1 has a first surface 11, and a second surface 12 opposite to the first surface 11. The substrate 1 defines a height direction H perpendicular to the first surface 11. The substrate 1 is provided with a plurality of conductive pillars 13 embedded therein. An end of each of the conductive pillars 13 is exposed from the first surface 11 of the substrate 1, and another end of each of the conductive pillars 13 is exposed from the second surface 12 of the substrate 1.

The electrode layer 2 is disposed on the first surface 11 of the substrate 1, and the solder pad layer 3 is disposed on the second surface 12 of the substrate Two opposite ends of each of the conductive pillars 13, which are respectively exposed from the first surface 11 and the second surface 12 of the substrate 1, are respectively connected to the electrode layer 2 and the solder pad layer 3, such that the electrode layer 2 and the solder pad layer 3 are electrically connected to each other through the conductive pillars 13.

The lighting unit U in the present embodiment includes a lighting diode 4 and a submount 7. The lighting diode 4 is disposed on the submount 7, and is configured to emit a light having a wavelength within a range of 180 nm~410 nm (e.g., 260 nm~270 nm, 270 nm~290 nm, 305 nm~315 nm, or 320 nm~330 nm), but the present disclosure is not limited thereto. The lighting diode 4 has a top surface 41 and a surrounding lateral surface 42 connected to a peripheral edge of the top surface 41.

Moreover, the lighting diode 4 is disposed above the first surface 11 of the substrate 1, and is electrically connected to the electrode layer 2 and the solder pad layer 3. The electrical connection manner between the lighting diode 4 and the electrode layer 2 can be adjusted or changed according to design requirements. For example, as shown in FIG. 14A, the lighting diode 4 is connected to the submount 7 fixed on the electrode layer 2 in a flip-chip bonding manner, and the submount 7 is electrically connected to the electrode layer 2 in a wiring manner (e.g., a normal bonding or a reverse bonding) for establishing the electrical connection between the lighting diode 4 and the electrode layer 2.

The wall 5 in the present embodiment can be an aluminum wall or a polymer wall formed on the substrate 1, or the substrate 1 and the wall 5 can be integrally formed as a one-piece structure by a high temperature co-fired ceramic (HTCC) process or a low temperature co-fired ceramic (LTCC) process, but the present disclosure is not limited thereto.

The wall 5 is disposed on the first surface 11 of the substrate 1. The wall 5 and the first surface 11 of the substrate 1 jointly define an accommodating space S, and the lighting diode 4 is arranged in the accommodating space S. In other words, a top end of the wall 5 is higher than the top surface 41 of the lighting diode 4.

The package compound 6 allow light generated by the lighting unit U to pass there-through. Specifically, the material of the package compound 6 in the present embodiment includes a polydimethylsiloxane (PDMS) or a fluoropolymer, but the present disclosure is not limited thereto. The package compound 6 is arranged in the accommodating space S, and the electrode layer 2 and the lighting diode 4 are entirely (or at least partially) embedded in the package compound 6. Moreover, a top end of the package compound 6 has a cross section that is in a substantial W shape (as shown in FIG. 14A), but the package compound 6 of the present disclosure is not limited by the present embodiment.

Specifically, the package compound 6 includes an attaching portion 61 adhered to the top surface 41 of the lighting diode 4 and a surrounding portion 62 arranged around the attaching portion 61. The top surface 41 of the lighting diode 4 is entirely covered by the attaching portion 61. The attaching portion 61 is substantially in a cone shape and has a curved outer surface. A cross section of the attaching portion 61 perpendicular to the height direction H gradually becomes bigger in a direction from a top end 611 of the attaching portion 61 toward the top surface 41 of the lighting diode 4. A height H1 of the top end 611 of the attaching portion 61 with respect to the first surface 11 is lower than a height H2 of the top end 51 of the wall 5 with respect to the first surface 11. In addition, in other embodiments of the present disclosure, the height H1 of the top end 611 of the attaching portion 61 with respect to the first surface 11 can be higher than a height H2 of the top end 51 of the wall 5 with respect to the first surface 11. That is to say, the top end 611 of the attaching portion 61 is lower than the top end 51 of the wall 5, thereby preventing the light-permeable cover 8 from pressuring the attaching portion 61.

Moreover, the surrounding portion 62 has an inner annular part 621, an outer annular part 622, and a top surface 623 connecting a top end of the inner annular part 621 and a top end of the outer annular part 622. The inner annular part 621 is connected to a peripheral edge of a bottom part 612 of the attaching portion 61 and the surrounding lateral surface 42 of the lighting diode 4. The outer annular part 622 is connected to an inner surface of the wall 5, and a height of the outer annular part 622 with respect to the substrate 1 is greater than a height of the top surface of the lighting unit U with respect to the substrate 1. The surrounding portion 62 has an annular slot formed on the top surface 623 thereof. That is to say, a height of the top surface 623 of the surrounding portion 62 with respect to the surface 11 of the substrate 1 gradually decreases in a direction from the two end of the surrounding portion 62 toward a substantial center thereof.

Specifically, a bottom end 6231 of the annular slot is located at a position aligning with 25%~90% of the thickness T of the lighting diode 4 and the submount 7 along the height direction H. In other words, in a cross section of the package compound 6 parallel to the height direction H and passing through the lighting diode 4, a top end of the cross section of the package compound 6 is in a substantial W shape that is formed by the outer surface of the attaching portion 61 and the top surface 623 of the surrounding portion 62.

In addition, since the surrounding portion 62 is connected to the peripheral edge of the bottom part 612 of the attaching portion 61, the curvature of the curved top surface 623 of the surrounding portion 62 can be adjusted according to design requirements. In the present embodiment, the top end 611 of the attaching portion 61 and a top end 6221 of the outer annular part 622 of the surrounding portion 62 are substantially arranged at the same height with respect to the substrate 1, such that the top surface 623 of the surrounding portion 62 can be formed with a larger radius of curvature, but the present disclosure is not limited thereto. Specifically, a center of curvature of the top surface 623 is located outside of the accommodating space S. Therefore, light emitted from the top surface 623 of the surrounding portion 62 can be gathered outside of the wall 5, thereby preventing light spots from being formed inside of the wall 5.

Moreover, since the surrounding portion 62 is connected to the peripheral edge of the bottom part 612 of the attaching portion 61, the surrounding lateral surface 42 of the lighting diode 4 can be entirely covered by the surrounding portion 62, thereby preventing light leakage from the package structure 100. In summary, the package compound 6 in the present embodiment excludes a configuration where an attaching portion 61 and a surrounding portion 62 are separate from each other. A lighting efficiency of the package structure 100 of the present embodiment is more than that of another package structure, being without a W-shaped cross section and having a light-permeable cover 8 covering the lighting unit U, by 26%. Moreover, the light-permeable cover 8 can be prevented from exploding due to an internal air pressure when the package structure 100 is heated, so that the reliability of the package structure 100 is not affected.

Figure 14B:
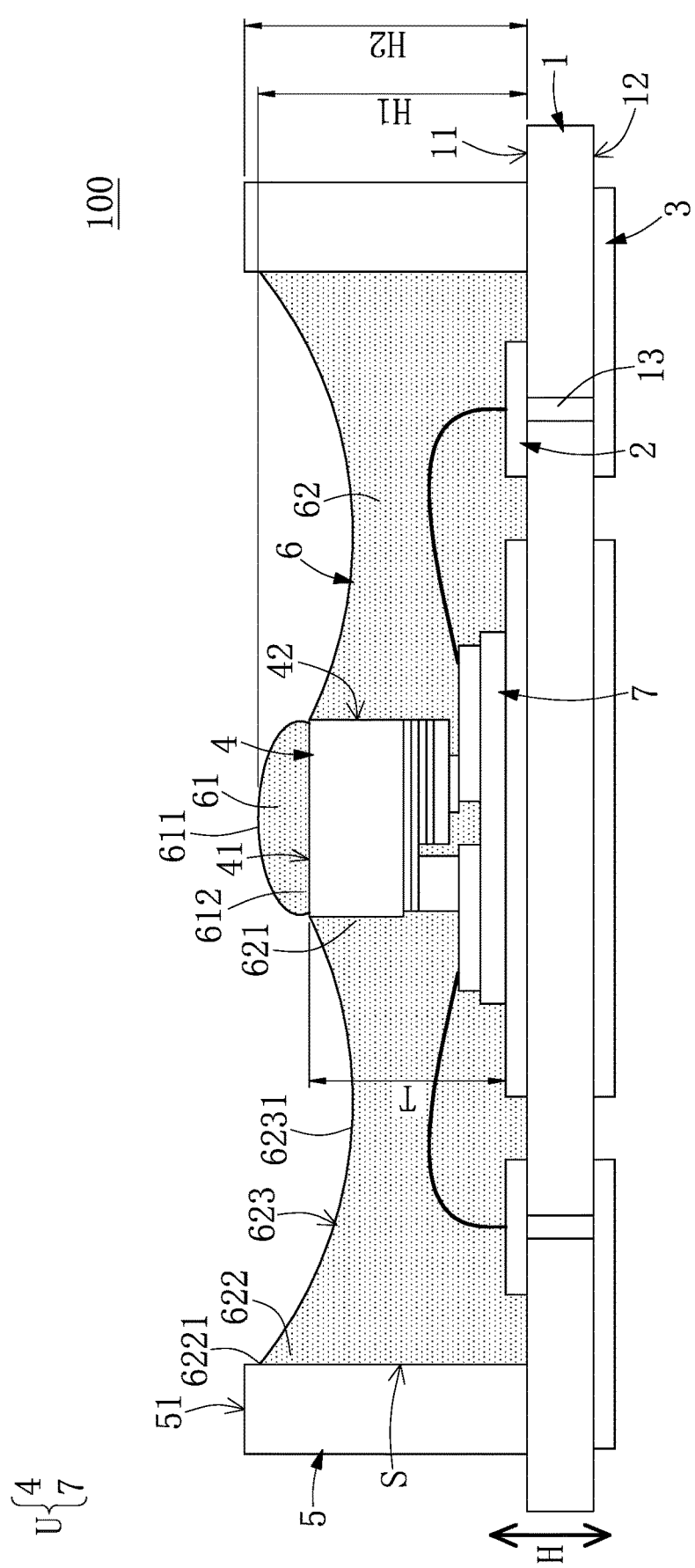
FIG. 14B is a schematic view showing the package structure in another configuration according to the first embodiment of the present disclosure.

In addition, the inner annular part 621 of the surrounding portion 62 in the present embodiment is arranged adjacent to and connected to the attaching portion 61, but the present disclosure is not limited thereto. For example, as shown in FIG. 14B, the inner annular part 621 of the surrounding portion 62 can be arranged adjacent to and spaced apart from the attaching portion 61.

Second Embodiment

Figure 15A:
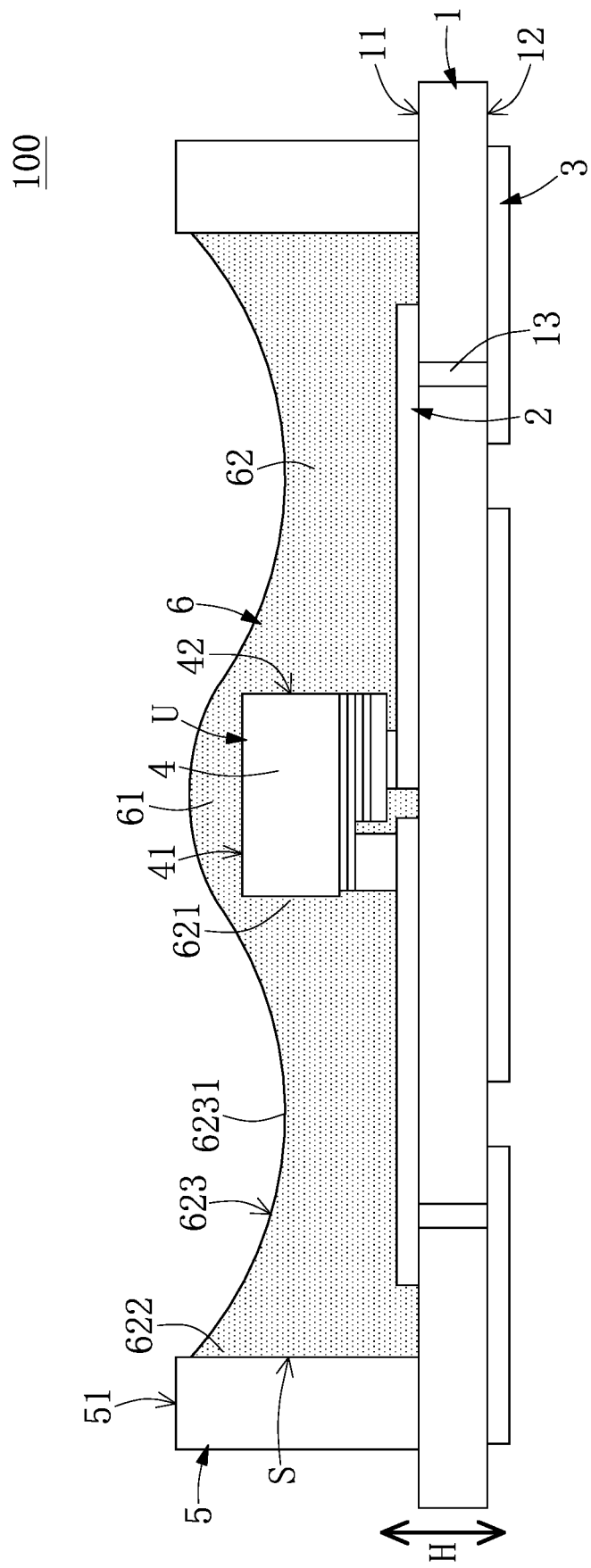
FIG. 15A is a schematic view showing a package structure according to a second embodiment of the present disclosure.
Figure 15B:
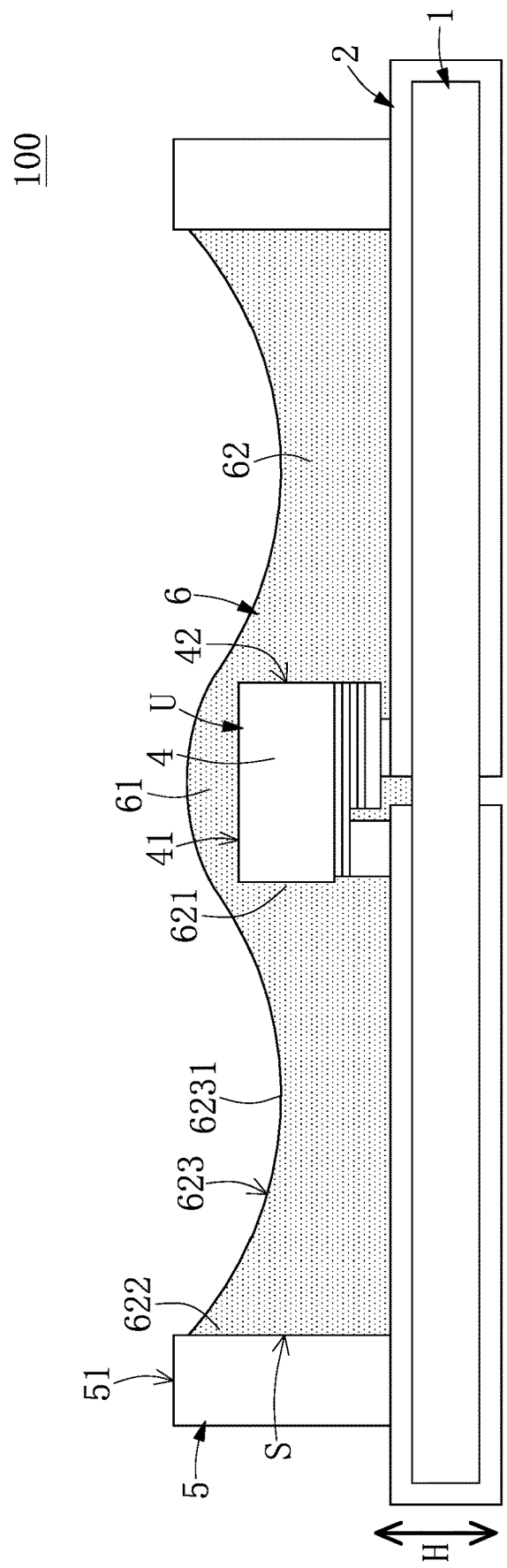
FIG. 15B is a schematic view showing the package structure in another configuration according to the second embodiment of the present disclosure.

Reference is made to FIG. 15A and FIG. 15B, which illustrates a second embodiment of the present disclosure. The second embodiment is similar to the first embodiment, so that the identical features are not disclosed in the following description. The difference between the second embodiment and the first embodiment resides in the lighting unit U. Specifically, as shown in FIG. 15A, the lighting unit U of the present embodiment includes only the lighting diode 4, which is directly mounted on the electrode layer 2.

Moreover, as shown in FIG. 15B, the electrode layer 2 (i.e., the pair of electrodes 2) can be formed as a leadframe configuration.

It should be noted that the thickness T of the lighting unit U in the present embodiment is defined by a distance from a bottom end of the lighting diode 4 to the top surface 41 of the lighting diode 4. In other words, the bottom end of the lighting diode 4 is aligned with a position corresponding to 0% of the thickness T, and the top surface 41 of the lighting diode 4 is aligned with a position corresponding to 100% of the thickness T.

Third Embodiment

Figure 16:
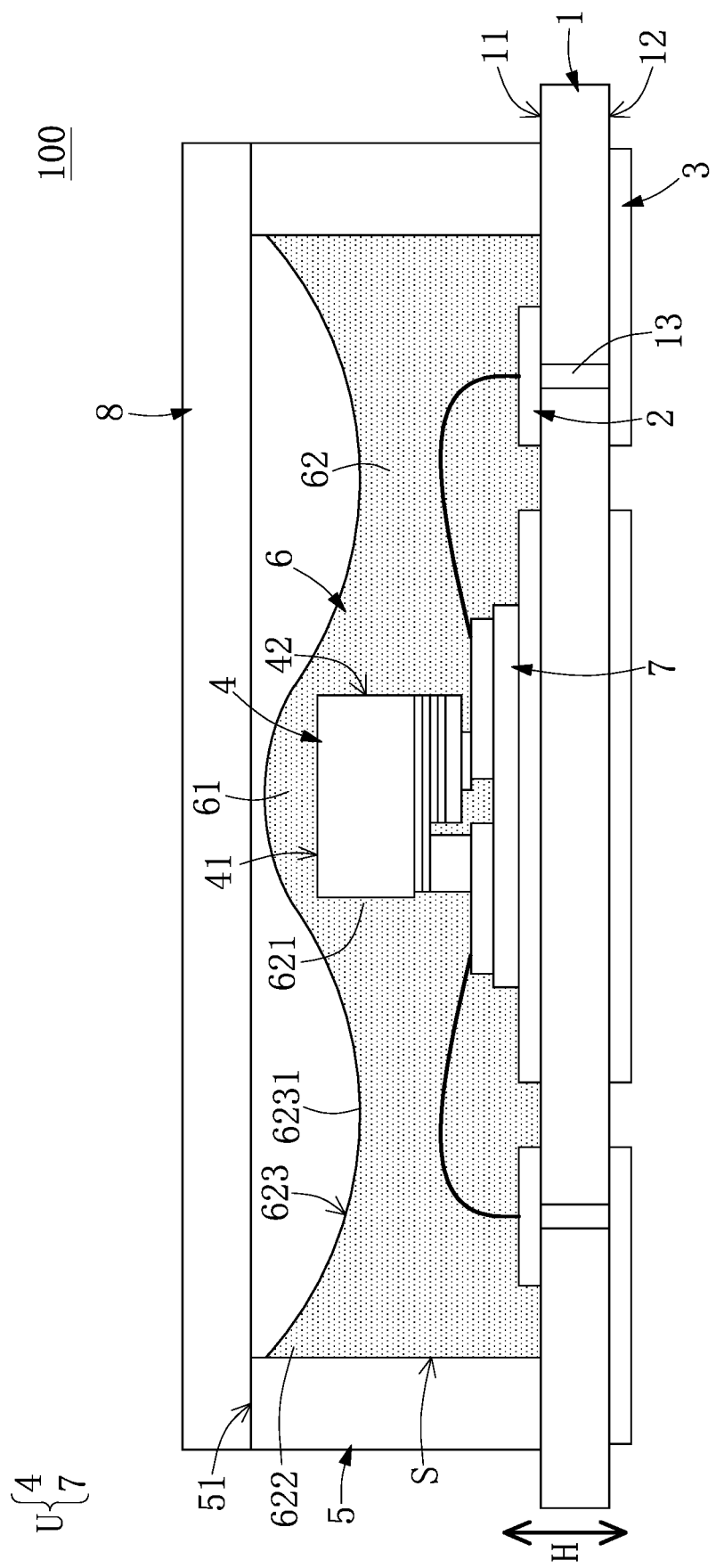
FIG. 16 is a schematic view showing a package structure according to a third embodiment of the present disclosure.

Reference is made to FIG. 16, which illustrates a third embodiment of the present disclosure. The third embodiment is similar to the first and second embodiments, so that the identical features are not disclosed in the following description. The difference between the third embodiment and the first and second embodiments is disclosed as follows. The package structure 100 of the present embodiment further includes a light-permeable cover 8 (e.g., a transparent plate). The light-permeable cover 8 is disposed on the top end 51 of the wall 5 so as to enclose the accommodating space S. That is to say, the light-permeable cover 8 is arranged above the lighting unit U. The lighting unit U can only include a lighting diode 4, or the lighting unit U can include a lighting diode 4 and a submount 7. Accordingly, the lighting efficiency of the package structure 100 of the present embodiment is more than that of another package structure mentioned in the first embodiment by 13%. Moreover, since the package structure 100 of the present embodiment is provided with the package compound 6 having a W-shaped cross section, an external air in the package structure 100 can be reduced. Accordingly, the light-permeable cover 8 can be prevented from exploding due to an internal air pressure when the package structure 100 is heated, so that the reliability of the package structure 100 is not affected.

In addition, the light-permeable cover 8 in the present embodiment is a flat plate, but the present disclosure is not limited thereto. For example, in other embodiments of the present disclosure, the light-permeable cover 8 can be a dome lens.

Fourth Embodiment

Figure 17:
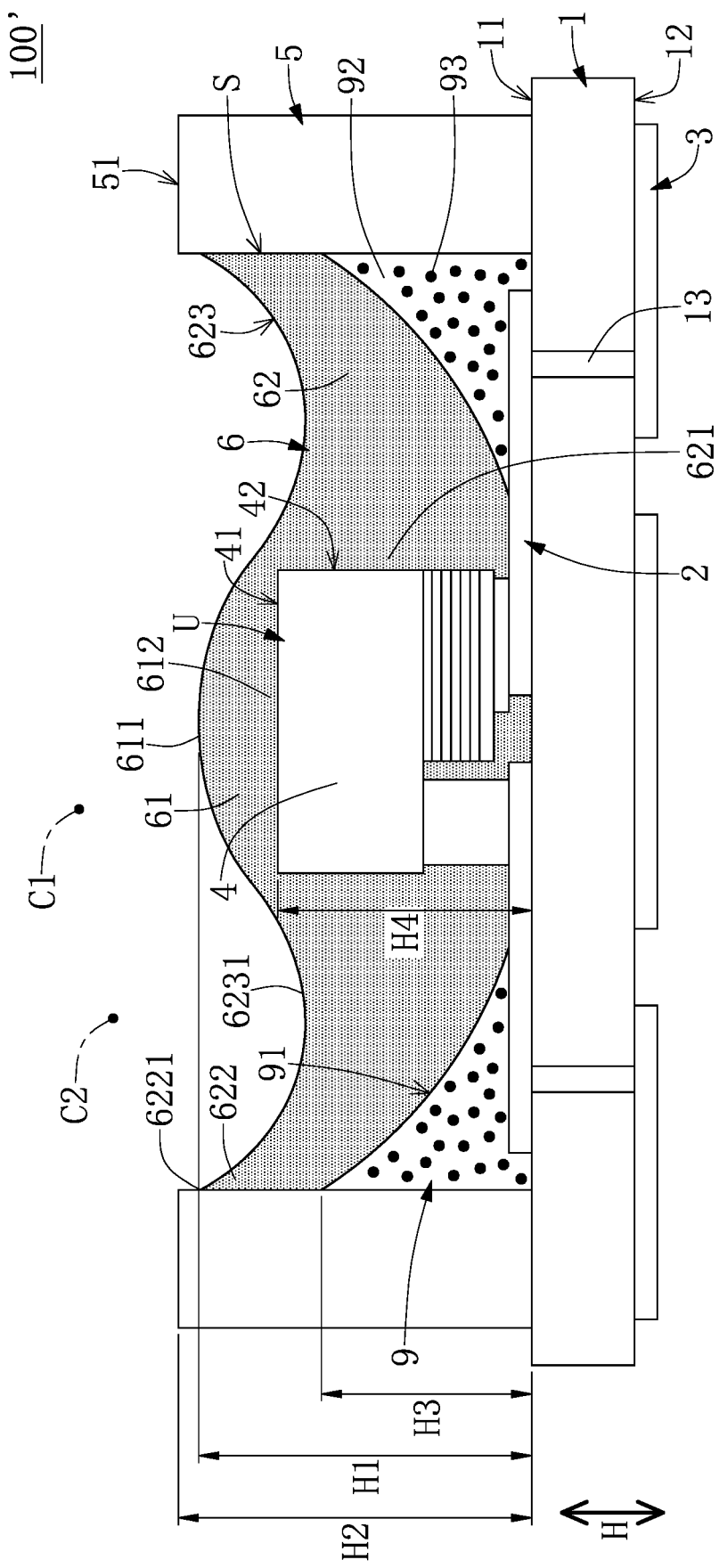
FIG. 17 is a cross-sectional schematic view of a package structure according to a fourth embodiment of the present disclosure.

Referring to FIG. 17, the present embodiment is similar to the second embodiment, and the similarities between the present embodiment and the second embodiment will not be repeated herein. The differences of the present embodiment from the second embodiment are mainly as follows.

The package structure 100' in the present embodiment further includes a reflective layer 9 disposed in the accommodating space S, and the reflective layer 9 at least covers a part of the electrode layer 2 and is covered by the package compound 6. Specifically, in a section along the height direction H, the reflective layer 9 is contacted the inner side of the wall 5 and a part of the substrate 1 that face the lighting unit U. The reflective layer 9 has a first curved surface 91 that is formed along the inner side of the wall 5 and a part of the substrate 1 adjacent to the wall 5, and a center C1 of a curvature (i.e., a circle center) of the first curved surface 91 is preferably arranged outside of the accommodating space S.

Moreover, a height H3 of the first curved surface 91 relative to the substrate 1 is less than or equal to the height H4 (not the thickness T) of the top surface 41 of the lighting diode 4 relative to the substrate 1, so that the first curved surface 91 can reflect the light emitted by the surrounding lateral surface 42 of the lighting diode 4. It should be noted that the height H3 of the first curved surface 91 refers to a height position of reflective layer 9 along the inner edge of the wall 5 in the section along the height direction H. Furthermore, it is worth noting that in another embodiment of the present disclosure that is not shown, the reflective layer 9 preferably completely covers the electrode layer 2 so as to avoid the light emitted by the surrounding lateral surface 42 of the lighting diode 4 be absorbed by the electrode layer 2 and the substrate 1.

In addition, the reflective layer 9 in the present embodiment contains a resin 92 and a plurality of reflective particles 93, and the reflective particles 93 are selected from the group consisting of Teflon®, aluminum, and zirconium dioxide (ZrO2), but the present embodiment is not limited thereto. The reflective particles 93 are evenly disposed in the resin 92. The concentration of reflective particles 93 are within a range within from 30 to 50 wt % based on a weight of the reflective layer 9. More preferably, the diameter of each of the reflective particles 93 is within a range from 10 μm (micrometers) to 20 μm (micrometers), so that the reflective layer 9 has high reflectivity with respect to the light having a wavelength ranged from 200 to 400 μm (micrometers).

In practice, the lighting unit U is arranged at a center of the package compound 6 and the surrounding portion 62 is formed symmetrically about the attaching portion, so that the light emitted by the surrounding lateral surface 42 of the lighting diode 4 can pass through the package compound 6 and be evenly reflected by reflective layer 9, but the present disclosure is not limited thereto.

Moreover, the top surface 623 of the surrounding portion 62 is in a curved shape so as to define as a second curved surface, and a center C2 of a curvature (i.e., a circle center) of the second curved surface is arranged outside of the accommodating space. The curvature of the first curved surface 91 is preferably greater than the curvature of the second curved surface, and the center C1 of the curvature of the first curved surface 91 and the center C2 of the curvature of the second curved surface is respectively located on a path of the light emitted by the lighting diode 4, so that the light emitted from the top surface 623 of the surrounding portion 62 can be gathered outside of the wall 5, thereby preventing light spots from being formed inside of the wall 5.

In addition, Table 1 shows an experimental data of the package structure 100' of the present embodiment obtained through the above-mentioned structure. Specifically, the Table 1 is a comparison table of the package structure 100' of the present embodiment, the package structure 100 of the second embodiment, and two different conventional package structures PA,PB under the same service life. The improved light output rate (mW %) in Table 1 is based on comparing with a package structure that does not have any package compound. For description, the following briefly introduces the structures of the two different conventional package structures PA,PB, and then describes Table 1.

Figure 20:
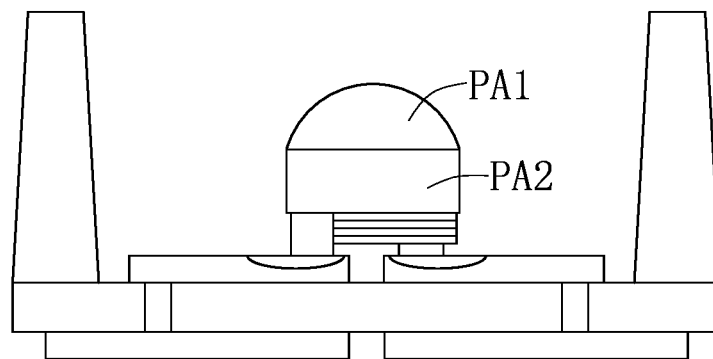
FIG. 20 is a cross-sectional schematic view of a first conventional package structure.
Figure 21:
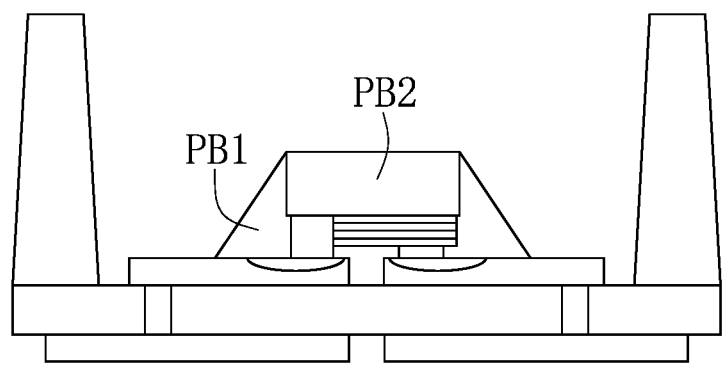
FIG. 21 is a cross-sectional schematic view of a second conventional package structure.

The conventional package structures PA is roughly shown in FIG. 20, and the feature of the conventional package structures PA is that a convex lens PA1 covers on a lighting unit PA2. The conventional package structures PB is roughly shown in FIG. 21, and the feature of the conventional package structures PB is that a lens PB1 is disposed around a side surface of the lighting unit PB2.

TABLE 1

|  | Present disclosure | | Conventional technology | |
| --- | --- | --- | --- | --- |
|  | 100' (FIG. 17) | 100 (FIG. 15A) | PA (FIG. 20) | PB (FIG. 21) |
| Applicable power | Middle (5~10 mW) | Low (2 mW) | Low (2 mW) | Low (2 mW) |
| Improved light output rate (mW %) | 22.2% | 12% | 12% | 11% |

It can be known from Table 1 above that the package structure 100' of the present embodiment improves the light output rate by 22.2% through the above-mentioned structure, and the light output rate of the package structure 100' of the present embodiment is 10% more than the light output rate of each of the conventional package structures PA,PB. Furthermore, when the power of the package structure 100' of the present embodiment and the power of the conventional package structures PA,PB are each at middle power (e.g., 5~10 mW), the service life of the package structure 100' is greater than the service life of the conventional package structures PA,PB.

It should be noted that the above-mentioned structure of the present embodiment can also be applied to the package structure 100 in the third embodiment, so that the package structure 100 in the third embodiment can have the same beneficial effects as the present embodiment.

Fifth Embodiment

Figure 18:
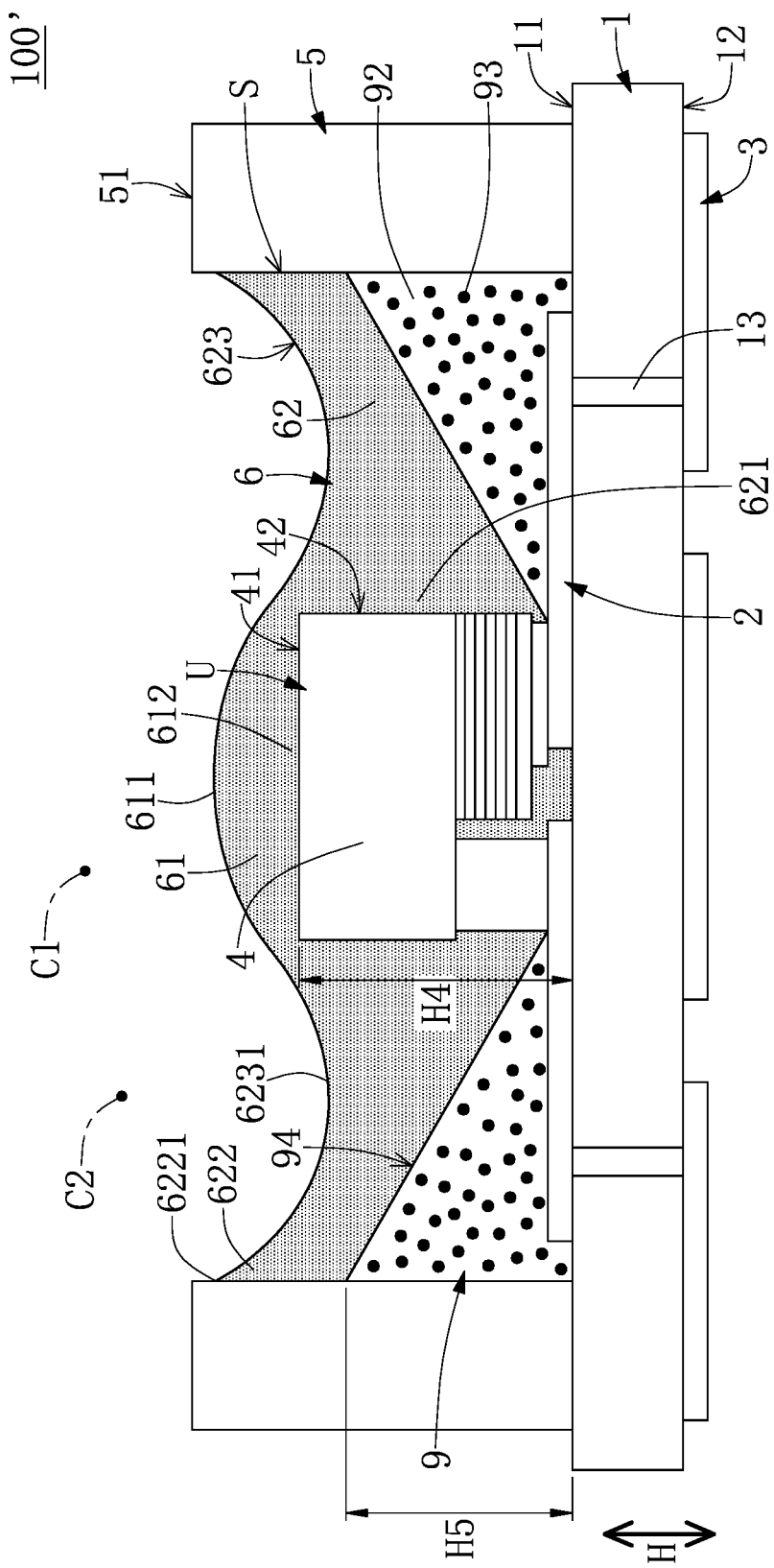
FIG. 18 is a cross-sectional schematic view of a package structure according to a fifth embodiment of the present disclosure.

Referring to FIG. 18, the present embodiment is similar to the fourth embodiment, and the similarities between the present embodiment and the fourth embodiment will not be repeated herein. The differences of the present embodiment from the fourth embodiment are mainly as follows.

The reflective layer 9 in the present embodiment does not have the first curved surface 91. Specifically, the reflective layer 9 in the present embodiment covers the electrode layer 2, and has a inclined surface 94 that is formed along the inner side of the wall 5 and a part of the substrate 1 adjacent to the wall 5. A height H5 of the inclined surface 94 of the reflective layer 9 relative to the substrate 1 is less than or equal to a height H4 of the top surface 41 of the lighting diode 4 relative to the substrate 1. The inclined surface 94 has a slope that is preferably within a range from 15 degrees to 60 degrees. The inclined surface 94 can reflect the light emitted by the lateral surface 42 of the lighting diode 4 to the outside of the accommodating space S so as to avoid the light from being absorbed by the electrode layer 2 and the substrate 1.

Sixth Embodiment

Figure 19:
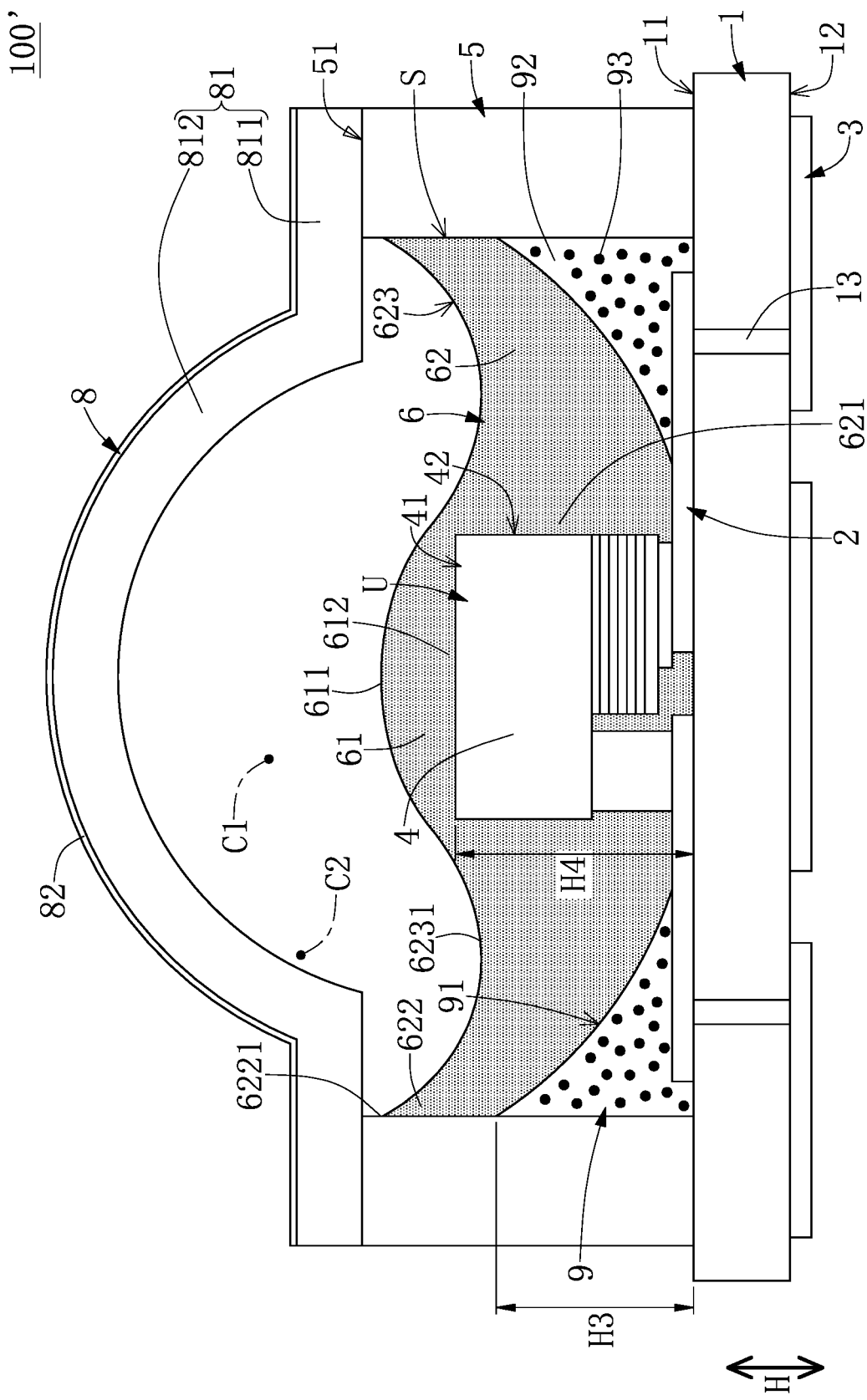
FIG. 19 is a cross-sectional schematic view of a package structure according to a sixth embodiment of the present disclosure.

Referring to FIG. 19, the present embodiment is similar to the fourth embodiment, and the similarities between the present embodiment and the fourth embodiment will not be repeated herein. The differences of the present embodiment from the fourth embodiment are mainly as follows.

The package structure 100' in the present embodiment further includes a lens unit 8 disposed on a top end 51 of the wall 5. The lens unit 8 includes a body 81 and an antireflection layer 82. The body 81 allow light to pass therethrough and has a base portion 811 and a bending portion 812 connected to the base portion 811. The base portion 811 is disposed on the top end 51 of the wall 5, the bending portion 812 corresponds in position to the lighting diode 4, and two ends of the bending portion 812 correspond in position to the annular slot. The antireflection layer is arranged on a side surface of the lens unit away from the substrate.

The bending portion 812 is bent outward in a direction away from the substrate 1 so as to have a curvature, and the designer can modify the light type emitted by the lighting diode 4 through adjusting the curvature of the bending portion 812.

In addition, when the body 81 is disposed on the wall 5, the body 81 closes the accommodating space S, so that the accommodating space S is in a sealed state. The accommodating space S is preferably kept in a vacuum to prevent moisture from entering the accommodating space S, thereby greatly increasing the service life of the package structure 100', but the present disclosure is not limited thereto. For example, the accommodating space S may also be filled with inert gas.

The antireflection layer 82 in the present embodiment is an anti-reflective coating (i.e., AR), and is arranged on a side surface of the lens unit 8 away from the substrate 1. The antireflection layer 82 can reduce the total reflection phenomenon caused by the light emitted by the lighting diode 4 entering the outside (e.g., air) from the body 81. In other words, the package structure 100' has more light energy by the lens unit 8, the reflective layer 9, and the package compound on the same unit area.

Beneficial Effects of the Embodiments

In conclusion, the package structure and the manufacturing method thereof provided by the present embodiment can increase the performance of the package structure (e.g., a lighting efficiency) through the configuration of the package compound. Moreover, the manufacturing method of the present embodiment can be carried out to effectively prevent spattering during a slicing process of the substrate assembly.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A package structure, comprising:
   a substrate;
   an electrode layer disposed on the substrate;
   a lighting unit disposed on the substrate and electrically connected to the electrode layer, wherein the lighting unit has a top surface and a surrounding lateral surface connected to a peripheral edge of the top surface;
   a wall disposed on the substrate, wherein the wall and the substrate jointly define an accommodating space, and the lighting unit is disposed in the accommodating space; and
   a light-permeable package compound disposed in the accommodating space and covering the lighting unit, wherein the light-permeable package compound includes:
   an attaching portion adhering to the top surface of the lighting unit; and
   a surrounding portion being a one-piece continuous layer with the attaching portion; and
   a reflective layer disposed in the accommodating space, covering at least a part of the electrode layer and being covered by the light-permeable package compound, wherein the reflective layer has a first curved surface, the first curved surface has a center of a curvature defined by a circle, the center of the curvature is arranged outside of the accommodating space;
   wherein a top surface of the surrounding portion is in a curved shape so as to define as a second curved surface, and the second curved surface has a center of a curvature defined by a circle, the center of the curvature is arranged outside of the accommodating space, and wherein the curvature of the first curved surface is greater than the curvature of the second curved surface.

2. The package structure according to claim 1, wherein the reflective layer contains a plurality of reflective particles that are within a range within from 30 to 50 wt % based on a weight of the reflective layer.

3. The package structure according to claim 1, wherein the first curved surface is formed along an inner side of the wall and a part of the substrate adjacent to the wall.

4. The package structure according to claim 3, wherein a height of the first curved surface relative to the substrate is less than or equal to a height of the top surface of the lighting unit relative to the substrate.

5. The package structure according to claim 2, wherein a diameter of each of the reflective particles is within a range from 10 micrometers to 20 micrometers.

6. The package structure according to claim 2, wherein the reflective particles are selected from the group consisting of Teflon®, aluminum, and zirconium dioxide ($ZrO_2$).

7. The package structure according to claim 1, further comprising a submount disposed on the electrode layer; wherein the lighting unit is electrically connected to two electrodes of the submount, and an electrical connection between the lighting unit and the electrode layer is established by wiring the two electrodes of the submount to the electrode layer.

8. The package structure according to claim 1, wherein a material of the light-permeable package compound includes a polydimethylsiloxane (PDMS) or a fluoropolymer.

9. The package structure according to claim 1, wherein a top end of the light-permeable package compound has a cross section that is in a substantial W shape.

10. The package structure according to claim 1, further comprising a lens unit; wherein the lens unit is disposed on a top end of the wall so as to close the accommodating space; wherein the accommodating space is vacuum.

11. The package structure according to claim 10, wherein the lens unit includes a body and an antireflection layer.

12. The package structure according to claim 11, wherein the body has a base portion and a bending portion connected to the base portion; wherein the base portion is disposed on the top end of the wall, the bending portion corresponds in position to the lighting unit, and two ends of the bending portion correspond in position to an annular slot of the surrounding portion; wherein the antireflection layer is arranged on a side surface of the lens unit away from the substrate.

13. The package structure according to claim 1, wherein the reflective layer completely covers the electrode layer.

14. The package structure according to claim 1, wherein the surrounding portion has an outer annular part connecting to an inner surface of the wall, wherein a height of the outer annular part with respect to the substrate is greater than a height of the top surface of the lighting unit with respect to the substrate.

15. The package structure according to claim 1, wherein the surrounding portion contacts the surrounding lateral surface of the lighting unit, so to allow light from the surrounding lateral surface of the lighting unit to enter.

16. The package structure according to claim 1, the surrounding portion has an annular slot formed on a top surface thereof, and a bottom end of the annular slot is located at a position aligning with 25%~90% of a thickness of the lighting unit along a height direction.

17. The package structure according to claim 1, wherein the lighting unit is arranged at a center of the package compound and the surrounding portion is formed symmetrically about the attaching portion.

18. The package structure according to claim 1, wherein a top surface of the light-permeable package compound being in contact with air above the light-permeable package compound.

* * * * *